(12) United States Patent
Park et al.

(10) Patent No.: US 11,742,329 B2
(45) Date of Patent: *Aug. 29, 2023

(54) SEMICONDUCTOR PACKAGE

(71) Applicant: SAMSUNG ELECTRONICS CO., LTD., Suwon-si (KR)

(72) Inventors: Jongho Park, Suwon-si (KR); Kyungsuk Oh, Suwon-si (KR); Hyunki Kim, Suwon-si (KR); Yongkwan Lee, Suwon-si (KR); Sangsoo Kim, Suwon-si (KR); Seungkon Mok, Suwon-si (KR); Junyoung Oh, Suwon-si (KR); Changyoung Yoo, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/399,233

(22) Filed: Aug. 11, 2021

(65) Prior Publication Data

US 2021/0375831 A1 Dec. 2, 2021

Related U.S. Application Data

(63) Continuation of application No. 16/680,657, filed on Nov. 12, 2019, now Pat. No. 11,101,243.

(30) Foreign Application Priority Data

May 3, 2019 (KR) .................... 10-2019-0052206

(51) Int. Cl.
*H01L 23/16* (2006.01)
*H01L 25/065* (2023.01)
(Continued)

(52) U.S. Cl.
CPC .......... *H01L 25/0657* (2013.01); *H01L 23/16* (2013.01); *H01L 23/3185* (2013.01);
(Continued)

(58) Field of Classification Search
CPC . H01L 2224/48227; H01L 2224/16227; H01L 23/3185; H01L 23/16; H01L 24/48;
(Continued)

(56) References Cited

U.S. PATENT DOCUMENTS 8,653,640 B2 2/2014 Kim et al.
8,791,532 B2 7/2014 Graf et al.
(Continued)

FOREIGN PATENT DOCUMENTS

JP 2008-147811 A 6/2008
JP 2008-205057 A 9/2008
(Continued)

*Primary Examiner* — Jasmine J Clark
(74) *Attorney, Agent, or Firm* — Lee IP Law, P.C.

(57) ABSTRACT

A semiconductor package including a circuit substrate including a plurality of interconnections; a first chip on the circuit substrate; a second chip stacked on the first chip; a plurality of first pads on the circuit substrate, the plurality of first pads overlapping the first chip; a plurality of bumps between the circuit substrate and the first chip; a plurality of second pads on an edge portion of a first side of the circuit substrate, the plurality of second pads electrically connected to the second chip through a conductive wire; an underfill that fills a space between the circuit substrate and the first chip; and a first dam on the circuit substrate, the first dam overlapping the first chip. The first dam includes a conductive material and overlaps at least one of the plurality of interconnections.

20 Claims, 12 Drawing Sheets

(51) Int. Cl.
*H01L 23/00* (2006.01)
*H01L 23/31* (2006.01)
*H01L 23/498* (2006.01)

(52) U.S. Cl.
CPC ........ *H01L 23/49811* (2013.01); *H01L 24/16* (2013.01); *H01L 24/48* (2013.01); *H01L 2224/16227* (2013.01); *H01L 2224/48227* (2013.01)

(58) Field of Classification Search
CPC ........... H01L 25/0657; H01L 23/49811; H01L 24/16; H10B 80/00
See application file for complete search history.

(56) References Cited

U.S. PATENT DOCUMENTS

| | | | |
|---|---|---|---|
| 8,803,304 B2 | 8/2014 | Igarashi et al. | |
| 9,887,104 B2 | 2/2018 | Dubey et al. | |
| 9,947,642 B2 | 4/2018 | Kumar et al. | |
| 11,101,243 B2 * | 8/2021 | Park | H01L 23/49811 |
| 2008/0237892 A1 * | 10/2008 | Saeki | H01L 25/0657 257/778 |
| 2010/0078791 A1 * | 4/2010 | Yim | H01L 25/105 257/E23.129 |
| 2010/0116534 A1 * | 5/2010 | Choi | H01L 23/49816 29/839 |

FOREIGN PATENT DOCUMENTS

| | | | | |
|---|---|---|---|---|
| JP | 2010-147225 A | 7/2010 | | |
| KR | 10-2006-0005722 A | 1/2006 | | |
| KR | 10-2012-0133651 A | 12/2012 | | |
| KR | 10-2016-0004922 A | 1/2016 | | |
| KR | 0170071791 A * | 6/2017 | ............. | H01L 23/28 |
| KR | 10-2018-0064402 A | 6/2018 | | |
| KR | 10-2018-0117764 A | 10/2018 | | |

\* cited by examiner

US 11,742,329 B2

SEMICONDUCTOR PACKAGE

CROSS-REFERENCE TO RELATED APPLICATION

This is a Continuation of U.S. patent application Ser. No. 16/680,657, filed Nov. 12, 2019, now U.S. Pat. No. 11,101,243, which is incorporated by reference herein in its entirety.

Korean Patent Application No. 10-2019-0052206, filed on May 3, 2019, in the Korean Intellectual Property Office, and entitled: "Semiconductor Package," is incorporated by reference herein in its entirety.

BACKGROUND

1. Field

Example embodiments relate to a semiconductor package that prevents contamination of a circuit substrate that is caused by an underfill such that a form factor of the semiconductor package is reduced.

2. Description of the Related Art

Demand for multifunctional semiconductor packages has been increased. Techniques for a System In Package (SIP) in a flip chip using wire bonding have been developed. The SIP may be filled with an underfill to protect bumps under the flip chip. The underfill may flow out to edges of the flip chip. Thus, a form factor of a semiconductor package may be increased due to the overflowed underfill. Further, when pad regions out of the flip chip are contaminated by the underfill, defects of SIP may also be increased.

SUMMARY

Embodiments are directed to a semiconductor package comprising: a circuit substrate including a plurality of interconnections; a first chip on the circuit substrate; a second chip stacked on the first chip; a plurality of first pads on the circuit substrate, the plurality of first pads overlapping the first chip; a plurality of bumps between the circuit substrate and the first chip; a plurality of second pads on an edge portion of a first side of the circuit substrate, the plurality of second pads electrically connected to the second chip through a conductive wire; an underfill that fills a space between the circuit substrate and the first chip; and a first dam on the circuit substrate, the first dam overlapping the first chip. The first dam includes a conductive material and overlaps at least one of the plurality of interconnections.

Embodiments are directed to a semiconductor package comprising: a circuit substrate including a plurality of interconnections; a first chip on the circuit substrate; a second chip stacked on the first chip; a plurality of first pads on the circuit substrate, the plurality of first pads overlapping the first chip; a plurality of bumps between the circuit substrate and the first chip; a plurality of second pads on an edge portion of one side of the circuit substrate and electrically connected to the second chip through a conductive wire; an underfill that fills a space between the circuit substrate and the first chip; a first dam on the circuit substrate, the first dam overlapping the first chip and blocking a flow of the underfill; and a second dam outside the first dam, the second dam overlapping the first chip. The second dam includes a conductive material and overlaps at least one of the plurality of interconnections.

Embodiments are directed to a semiconductor package comprising: a circuit substrate; a first chip on the circuit substrate; a second chip stacked on the first chip; a plurality of first pads on the circuit substrate, the plurality of first pads overlapping the first chip; a plurality of bumps between the circuit substrate and the first chip; a plurality of second pads on an edge portion of one side of the circuit substrate and electrically connected to the second chip through a conductive wire; an underfill that fills a space between the circuit substrate and the first chip; a first dam on the circuit substrate, the first dam overlapping the first chip; a second dam outside the first dam, the second dam overlapping the first chip; and a trench between the first dam and the second dam, the trench having a predetermined depth.

Embodiments are directed to a semiconductor package comprising: a circuit substrate; a first chip on the circuit substrate; a plurality of first pads disposed on the circuit substrate and arranged in a first direction; a plurality of bumps disposed on the circuit substrate and electrically connecting the circuit substrate and the first chip; an underfill that fills a space between the circuit substrate and the first chip; and a first dam disposed on the circuit substrate and extending in a second direction substantially perpendicular to the first direction, at least a portion of the first dam overlapping the first chip.

BRIEF DESCRIPTION OF THE DRAWINGS

Features will become apparent to those of skill in the art by describing in detail exemplary embodiments with reference to the attached drawings in which.

DETAILED DESCRIPTION

Hereinafter, semiconductor packages according to example embodiments will be described with reference to the accompanying drawings.

Figure 1:
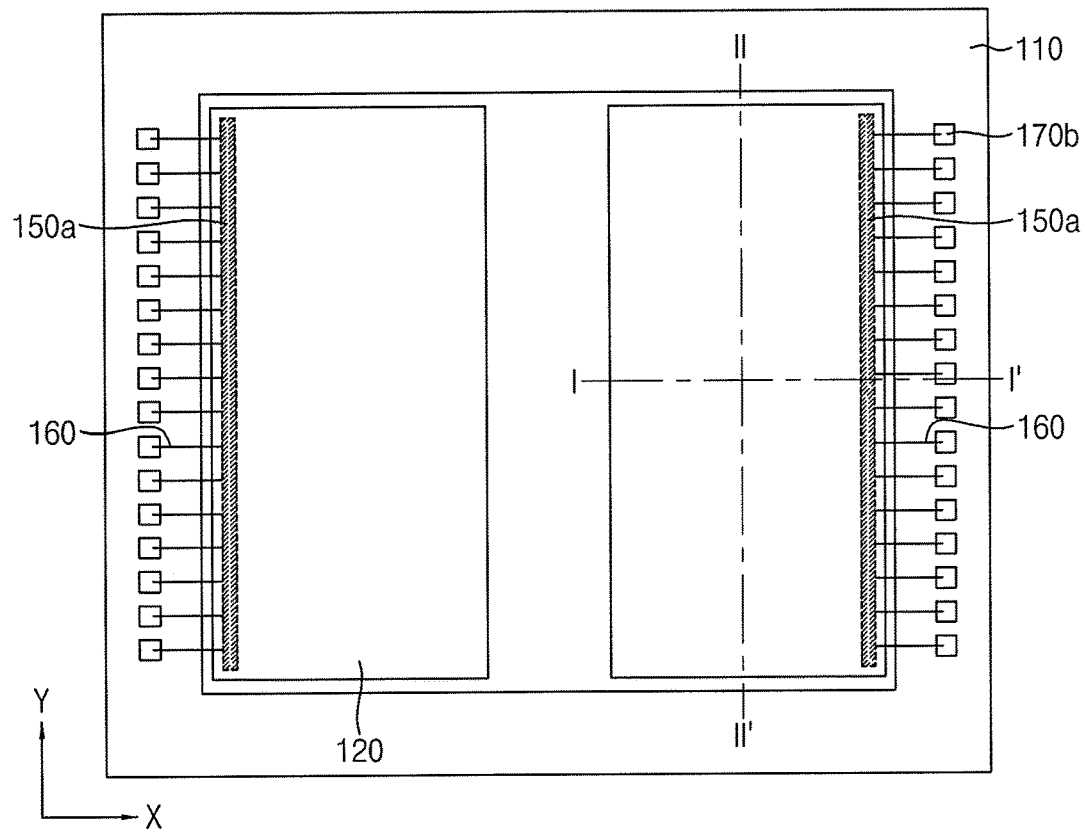
FIG. 1 illustrates a plan view of a semiconductor package 100a according to an example embodiment.
Figure 2A:
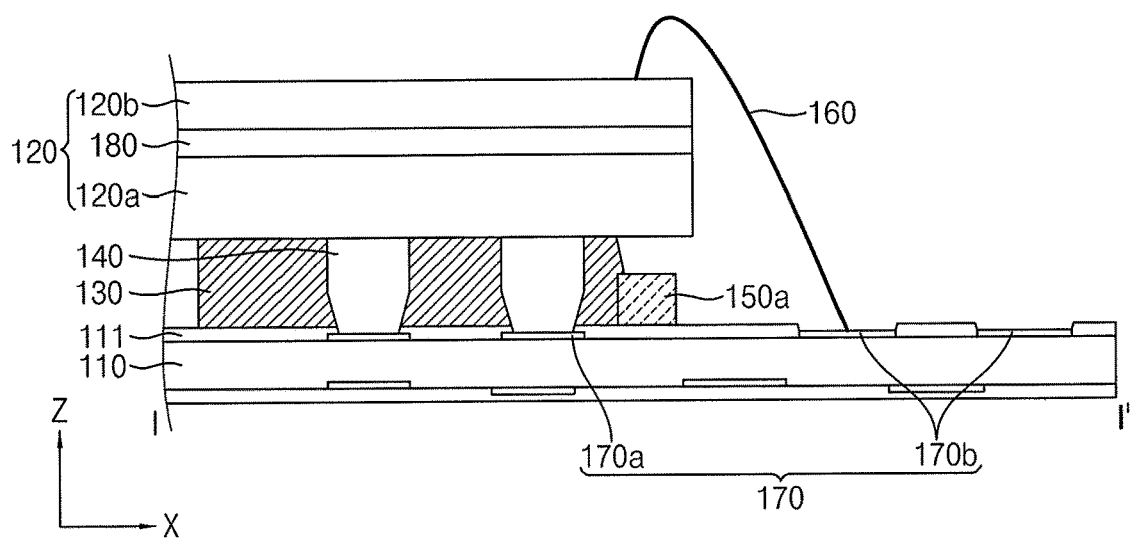
FIG. 2A illustrates a cross-sectional view taken along line I-I' in FIG. 1.
Figure 2B:
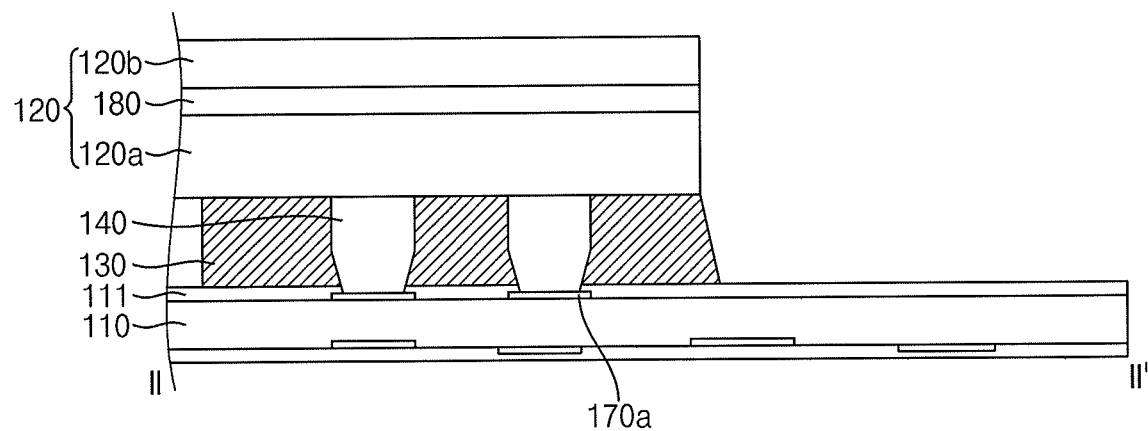
FIG. 2B illustrates a cross-sectional view taken along line II-II in FIG. 1.

FIG. 1 illustrates a plan view of a semiconductor package 100a according to an example embodiment. FIG. 2A illustrates a cross-sectional view taken along line I-I' in FIG. 1. FIG. 2B illustrates a cross-sectional view taken along line II-II' in FIG. 1.

Referring to FIGS. 1, 2A, and 2B, the semiconductor package 100a according to the example embodiment may include a circuit substrate 110, an insulating layer 111, a plurality of chip units 120, an underfill 130, a plurality of bumps 140, a plurality of dams 150a, a plurality of conductive wires 160, and a plurality of pads 170. Each of the plurality of chip units 120 may be formed by stacking a plurality of first and second chips 120a and 120b. For example, the plurality of chip units 120 may be arranged on the circuit substrate 110, e.g., in a horizontal direction.

For example, the circuit substrate 110 may be a printed circuit board (PCB). Alternatively, the circuit substrate 110 may be a semiconductor wafer. The plurality of pads 170 may be arranged on the circuit substrate 110, e.g., in the horizontal direction, and electrically connected to a first chip 120a and a second chip 120b. The plurality of pads 170 may be disposed on a top surface of the circuit substrate 110. A plurality of interconnections may be disposed on the circuit substrate 110. The insulating layer 111 (e.g., a solder resist film) may be formed on the top surface of the circuit substrate 110 to cover the plurality of interconnections. The insulating layer 111 may be selectively removed from a region in which the plurality of pads 170 are formed so that the plurality of pads 170 may be exposed to the outside.

For example, a plurality of first pads 170a of the plurality of pads 170 may be disposed on the circuit substrate 110 to overlap the first chip 120a, e.g., in an Z-axial direction. A plurality of second pads 170b of the plurality of pads 170 may be disposed on both edge portions of the circuit substrate 110, e.g., in an X-axial direction of the horizontal direction. For example, the plurality of second pads 170b may be disposed on both edge portions of the circuit substrate 110, e.g., in a Y-axial direction of the horizontal direction.

The circuit substrate 110 may include a first surface (e.g., the top surface) and a second surface (e.g., a bottom surface). A plurality of first and second chips 120a and 120b may be stacked on the first surface of the circuit substrate 110. The second surface of the circuit substrate 110 may be a side opposite to the first surface of the circuit substrate 110. An adhesive layer 180 may be formed between the first chip 120a and the second chip 120b so that the first chip 120a may be adhered to the second chip 120b. A multilayered interconnection, a plurality of transistors, and a plurality of passive devices may be integrated and disposed on the first chip 120a and the second chip 120b.

In an example embodiment, the first chip 120a and the second chip 120b may have the same area. A length of the first chip 120a in the X-axial direction may be equal to a length of the second chip 120b in the X-axial direction. A length of the first chip 120a in the Y-axial direction may be equal to a length of the second chip 120b in the Y-axial direction. In another embodiment, the first chip 120a and the second chip 120b may have different areas. The length of the first chip 120a in the X-axial direction may be different from the length of the second chip 120b in the X-axial direction. The length of the first chip 120a in the Y-axial direction may be different from the length of the second chip 120b in the Y-axial direction.

FIGS. 2A and 2B illustrate an example embodiment in which two chips 120a and 120b are stacked on the circuit substrate 110, e.g., in the Z-axial direction. For example, at least three chips may be stacked on the circuit substrate 110, e.g., in the Z-axial direction.

The insulating layer 111, e.g., a solder resist film, may be formed on the first surface and the second surface of the circuit substrate 110. For example, the solder resist film may be selectively removed to expose the plurality of pads 170 such that the exposed pads 170 may be connected to the first chip 120a and the second chip 120b.

The first chip 120a may be electrically connected to the plurality of first pads 170a, which are disposed in a central portion (e.g., a main area) of the circuit substrate 110, by the plurality of bumps 140. For example, the plurality of first pads 170a, which overlap the first chip 120a, may be electrically connected to the first chip 120a through the plurality of bumps 140.

The second chip 120b may be electrically connected to a plurality of second pads 170b, which are disposed an edge portion (e.g., a peripheral area) of the circuit substrate 110, by the plurality of conductive wires 160. For example, the plurality of second pads 170b may not overlap a lower portion of the first chip 120a, e.g., in the Z-axial direction, and may be electrically connected to the second chip 120b by the plurality of conductive wires 160.

The dam 150a may be disposed on the first surface of the circuit substrate 110. The dam 150a may prevent an underfill resin liquid from flowing out to the edge portion of the circuit substrate 110 when the underfill 130 is formed. The dam 150a may have a predetermined width (e.g., in the X-axial direction), a predetermined length (e.g., in the Y-axial direction), and a predetermined height (e.g., in the Z-axial direction). For example, the dam 150a may have a height corresponding to about 50% to 95% of a height of a gap between the circuit substrate 110 and the first chip 120a. For example, the height of the gap between the circuit substrate 110 and the first chip 120a may is a distance from an upper surface of the insulating layer 111 to a bottom surface of the first chip 120a in the Z-axial direction.

The dam 150a may be disposed on the circuit substrate 110 to overlap an edge portion of one side of the first chip 120a. For example, the dam 150a may be disposed on the upper surface of the insulating layer 111. The dam 150a is disposed in an "I" form to overlap the first chip 120a in a direction (e.g., the Y-axial direction) in which the plurality of second pads 170b are formed. The dam 150a may overlap at least one of four edge portions of the first chip 120a, which is adjacent to the plurality of second pads 170b. The dam 150a may be disposed between the underfill 130 and the plurality of second pads 170b. For example, when the semiconductor package 100a is viewed from above, the dam 150a may not be exposed beyond the first chip 120a because the dam 150a is completely disposed under the first chip 120a.

The first chip 120a may be electrically connected to the circuit substrate 110 through the plurality of bumps 140. The dam 150a may be disposed outside the plurality of bumps 140. For example, the dam 150a may be disposed beyond an outermost bump 140 of the plurality of bumps 140. When a position of the bump 140 is changed to be closer to the central portion of the circuit substrate 110, a position of the dam 150a may also be changed to be closer to the central portion of the circuit substrate 110.

The dam 150a may be formed of a material including at least one of, e.g., epoxy resin, phenol resin, and a silicone series. For example, the dam 150a may be formed of a first solution containing 40% epoxy resin and 10% silicone. For example, the dam 150a may be formed of variously combined materials that may be sprayed with a nozzle.

An encapsulant may encapsulate the first chip 120a and the second chip 120b. The encapsulant may include, e.g., an epoxy molding compound (EMC).

Figure 3A:
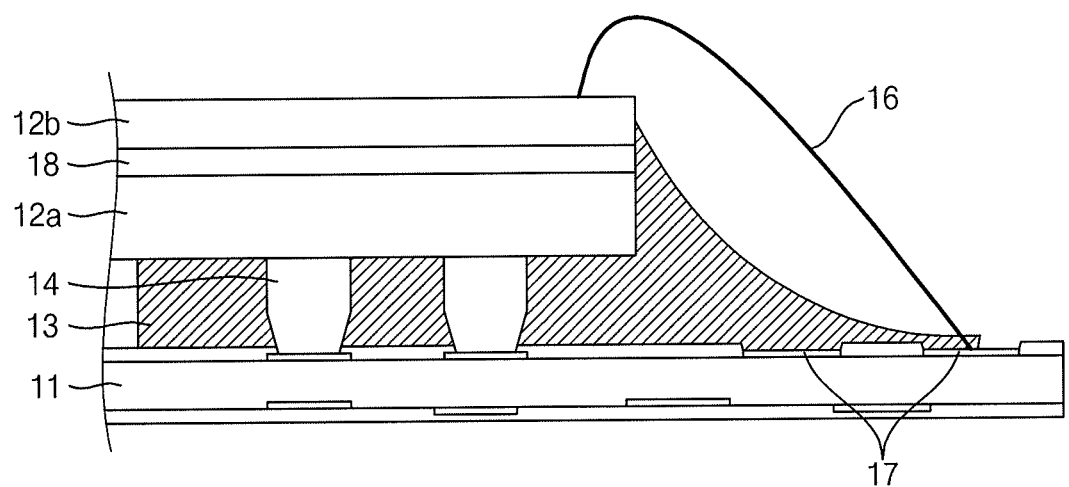
FIG. 3A illustrates an underfill 13 flowing out when a dam is not formed around a chip.
Figure 3B:
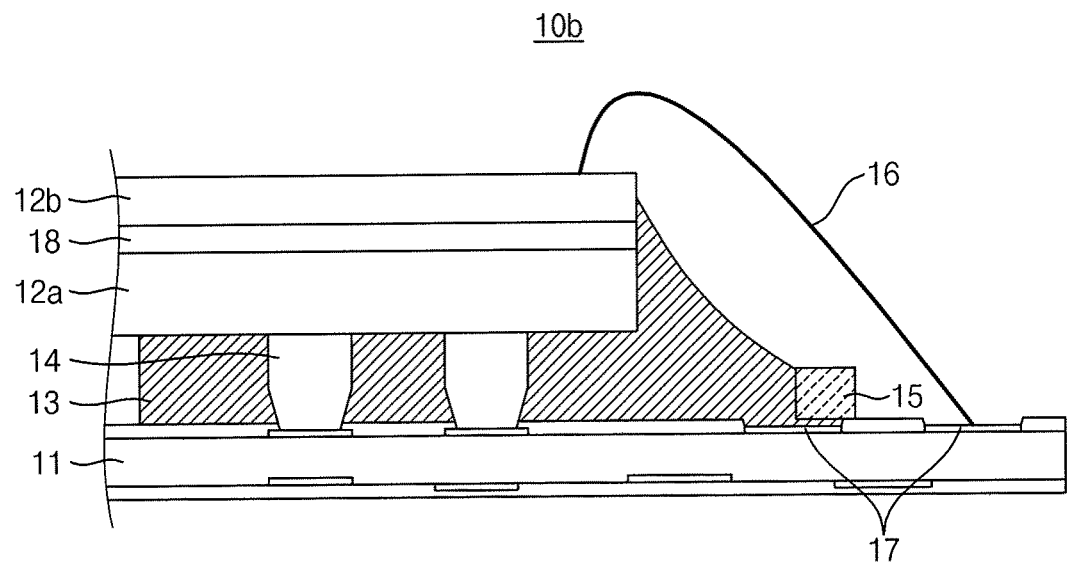
FIG. 3B illustrates an underfill 13 flowing out when a dam is formed outside the chip.

FIG. 3A illustrates an underfill 13 flowing out when a dam is not formed around a chip. FIG. 3B illustrates the underfill 13 flowing out when a dam is formed outside the chip.

Referring to FIG. 3A, a typical semiconductor package 10a may include a circuit substrate 11, a plurality of first and second chips 12a and 12b, an underfill 13, a plurality of bumps 14, a plurality of conductive wires 16, and a plurality of pads 17. When the dam is not formed around the plurality of first and second chips 12a and 12b, the underfill 13 may flow out to the circuit substrate 11 and may cover the pads 17 that do not overlap the plurality of first and second chips 12a and 12b.

Referring to FIG. 3B, in a typical semiconductor package 10b, a dam 15 may be formed beyond a plurality of first and second chips 12a and 12b. For example, the dam 15 may not overlap the plurality of first and second chips 12a and 12b. As the dam 15 is formed to be spaced from the plurality of first and second chips 12a and 12b by a predetermined distance, the underfill 13 may flow out to an edge portion of a circuit substrate 11 such that some pads 17, which are closer to the plurality of first and second chips 12a and 12b, may be covered by the underfill 13. Thus, other pads 17, which are further from the plurality of first and second chips 12a and 12b and are not covered by the underfill 13, may be connected to a plurality of conductive wires 16 such that a size of the semiconductor package 10b may be increased.

As described above, referring to FIG. 2A, the dam 150a in the semiconductor package 100a may overlap the first and second chips 120a and 120b and prevent the underfill 130 from flowing out toward an edge portion of the circuit substrate 110. For example, as the underfill 130 is formed in a region overlapping the plurality of first and second chips 120a and 120b, the plurality of second pads 170b, which is disposed on the edge portion of the circuit substrate 110, may not be contaminated or covered by the underfill 130. The plurality of second pads 170b may be formed in a region adjacent to the plurality of first and second chips 120a and 120b so that a size of the semiconductor package 100a may be decreased.

Figure 4:
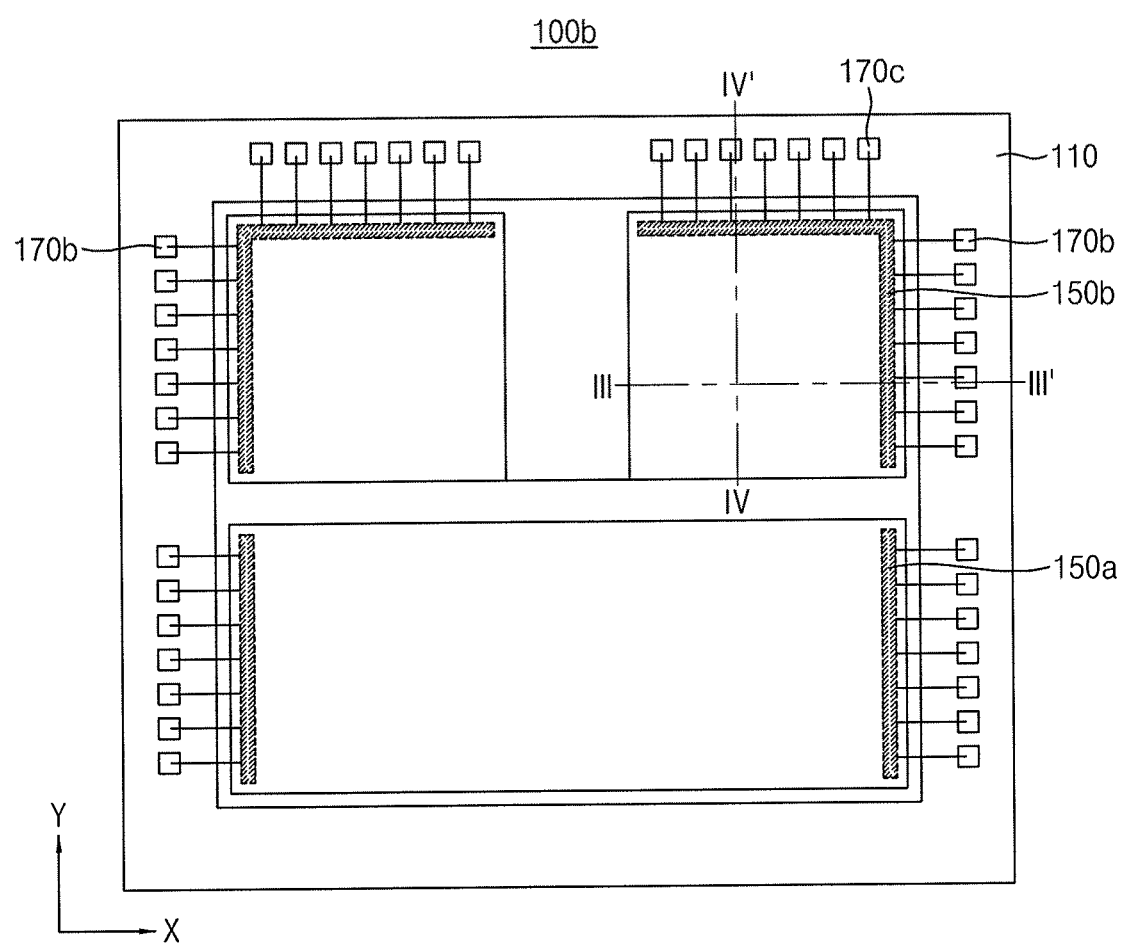
FIG. 4 illustrates a plan view of a semiconductor package 100b according to an example embodiment.
Figure 5A:
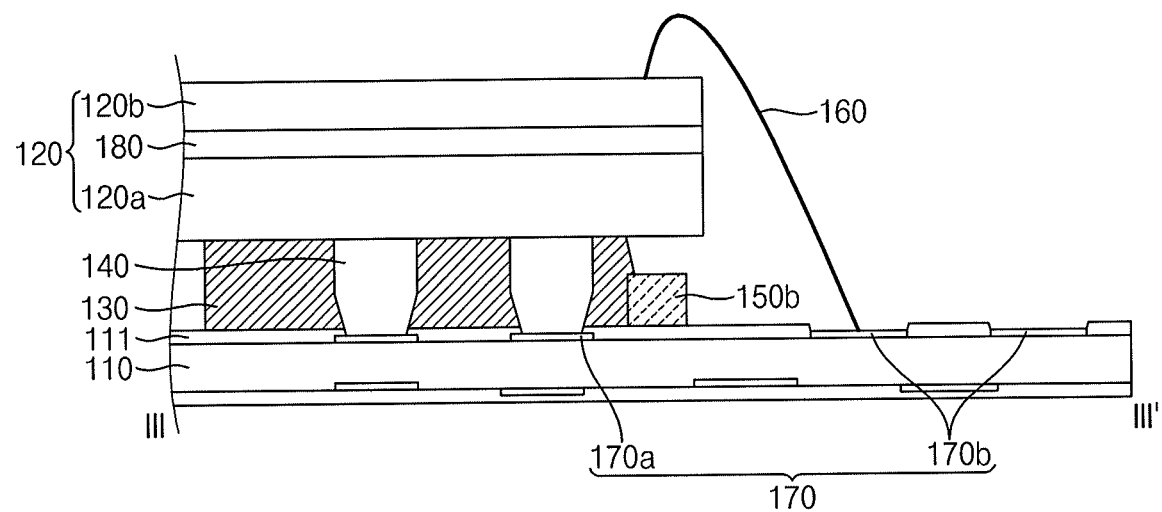
FIG. 5A illustrates a cross-sectional view taken along line III-III' in FIG. 4.
Figure 5B:
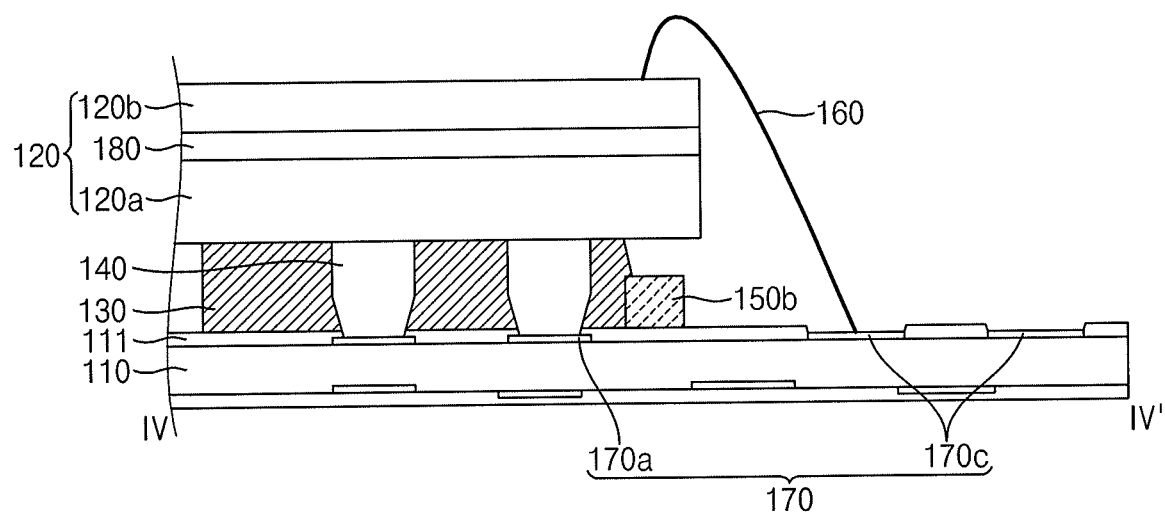
FIG. 5B illustrates a cross-sectional view taken along line IV-IV' in FIG. 4.

FIG. 4 illustrates a plan view of a semiconductor package 100b according to an example embodiment. FIG. 5A illustrates a cross-sectional view taken along line III-III' in FIG. 4. FIG. 5B illustrates a cross-sectional view taken along line IV-IV' in FIG. 4.

The semiconductor package 100b according to the example embodiment will be described with reference to FIGS. 4, 5A, and 5B. Descriptions of the same components as those of the semiconductor package 100a shown in FIGS. 1, 2A, and 2B may be omitted, and differences between the semiconductor package 100b in FIGS. 4, 5A, and 5B and the semiconductor package 100a in FIGS. 1, 2A, and 2B will mainly be described.

The semiconductor package 100b according to the example embodiment may include a circuit substrate 110, an insulating layer 111, a plurality of chip units 120, an underfill 130, a plurality of bumps 140, a plurality of dams 150b, a plurality of conductive wires 160, and a plurality of pads 170. Each of the plurality of chip units 120 may be formed by stacking a plurality of first and second chips 120a and 120b.

The plurality of pads 170 may be disposed on an entire surface of the circuit substrate 110. For example, a plurality of first pads 170a of the plurality of pads 170 may be disposed in a central portion of the circuit substrate 110 to overlap a first chip 120a. A plurality of second pads 170b of the plurality of pads 170 may be disposed on both edge portions of the circuit substrate 110 in an X-axial direction. A plurality of third pads 170c of the plurality of pads 170 may be disposed on an edge portion of one side of the circuit substrate 110 in a Y-axial direction.

The first chip 120a may be electrically connected to the plurality of first pads 170a in the central portion of the circuit substrate 110 through the plurality of bumps 140. For example, the plurality of first pads 170a that overlap the first chip 120a, may be electrically connected to the first chip 120a.

A second chip 120b may be electrically connected to the plurality of second pads 170b and the plurality of third pads 170c on the edge portions of the circuit substrate 110 through the plurality of conductive wires 160. For example, the plurality of second pads 170b and the plurality of third pads 170c may not overlap the first chip 120a. The plurality of second pads 170b and the plurality of third pads 170c may be electrically connected to the second chip 120b through the plurality of conductive wires 160.

The dam 150b may be disposed on a first surface (e.g., a top surface) of the circuit substrate 110. For example, the dam 150b may have a height corresponding to about 50% to 95% of a height of a gap between the circuit substrate 110 and the first chip 120a.

The dam 150b may be disposed on the circuit substrate 110 to overlap a plurality of edge portions of the first chip 120a. FIG. 4 illustrates the dam 150b that is on the circuit substrate 110 and overlaps two edge portions of the first chip 120a. For example, the dam 150b may be disposed on the circuit substrate 110 to overlap three edge portions of the first chip 120a.

For example, the dam 150b may be disposed in a "¬" shape on the circuit substrate 110 to overlap two edge portions of the first chip 120a. For example, the dam 150b may be disposed on the circuit substrate 110 to overlap both edge portions of the first chip 120a in the X-axial direction. Further, the dam 150b may be disposed on the circuit substrate 110 to overlap both edge portions of the first chip 120a in the Y-axial direction. For example, when the semiconductor package 100b is viewed from above, the dam 150b may not be exposed beyond the first chip 120a because the dam 150b is disposed in the "¬" shape under the first chip 120a.

For example, the first chip 120a may be electrically connected to the circuit substrate 110 through the plurality of bumps 140. The dam 150b may be disposed outside the plurality of bumps 140. For example, the dam 150b may be disposed beyond an outermost bump 140 of the plurality of bumps 140. When a position of the bump 140 is changed to be closer to the central portion of the circuit substrate 110, a position of the dam 150a may be changed to be closer to the central portion of the circuit substrate 110.

According to an example embodiment, the dam 150b in the semiconductor package 100b may be arranged in a "¬" shape to overlap two edge portions of the first chip 120a, and prevent the underfill 130 from flowing out toward an edge portion of the circuit substrate 110. For example, the underfill 130 may not flow out toward the edge portions of the circuit substrate 110 on which the plurality of second pads 170b and the plurality of third pads 170c are disposed. The plurality of second pads 170b and the plurality of third pads 170c, which are disposed on the edge portions of the circuit substrate 110, may not be contaminated or covered by the underfill 130. The plurality of second pads 170b and the plurality of third pads 170c may be formed in a region adjacent to the plurality of first and second chips 120a and 120b so that a size of the semiconductor package 100b may be decreased.

For example, the plurality of conductive wires 160 may connect between the plurality of second chips 120b and some of the plurality of second pads 170b that are the closest to the plurality of second chips 120b and do not overlap the plurality of second chips 120b. Further, the plurality of conductive wires 160 may connect between the plurality of second chips 120b and some of the plurality of third pads 170c that are the closest to the plurality of second chips 120b and do not overlap the plurality of second chips 120b. Thus, the size of the semiconductor package 100b may be reduced.

Figure 6:
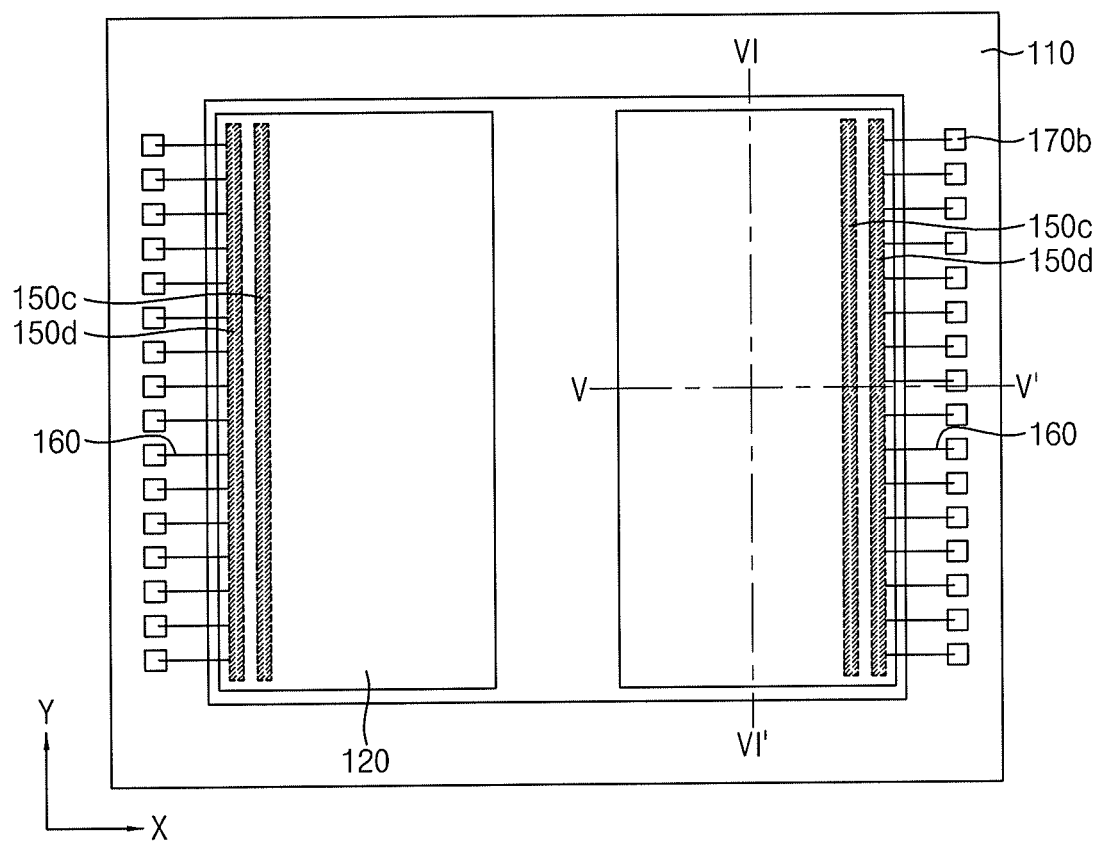
FIG. 6 illustrates a plan view of a semiconductor package 100c according to an example embodiment.
Figure 7A:
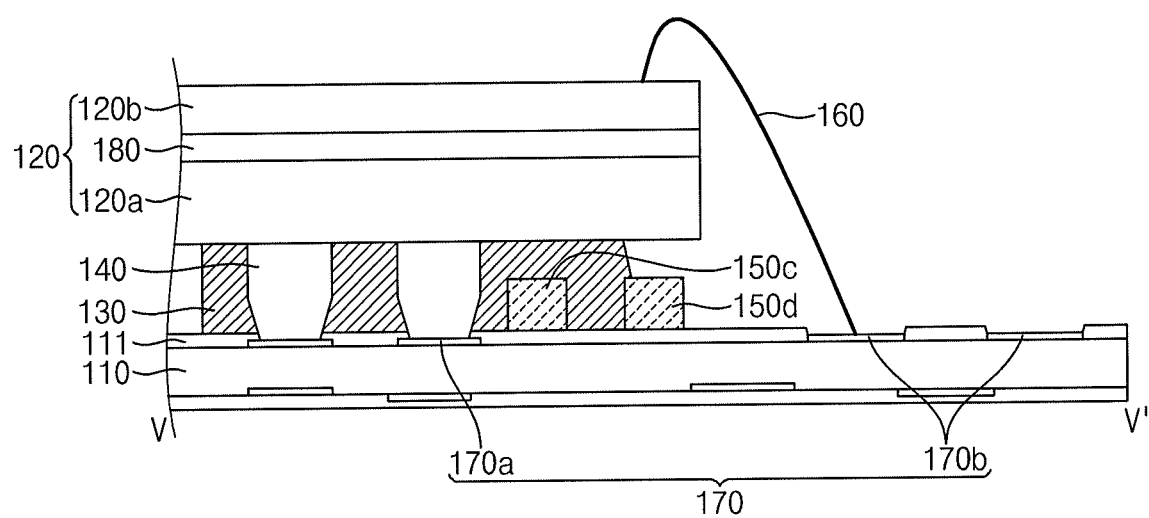
FIG. 7A illustrates a cross-sectional view taken along line V-V' in FIG. 6.
Figure 7B:
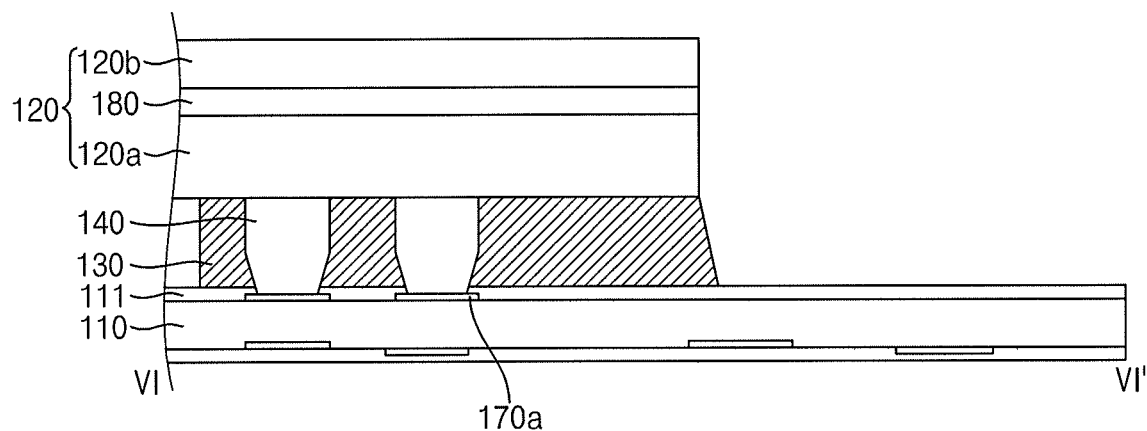
FIG. 7B illustrates a cross-sectional view taken along line VI-VI' in FIG. 6.

FIG. 6 illustrates a plan view of a semiconductor package 100c according to an example embodiment. FIG. 7A illustrates a cross-sectional view taken along line V-V' in FIG. 6. FIG. 7B illustrates a cross-sectional view taken along line VI-VI' in FIG. 6.

The semiconductor package 100c according to the example embodiment will be described with reference to FIGS. 6, 7A, and 7B. Descriptions of the same components as those of the semiconductor package 100a shown in FIGS. 1, 2A, and 2B may be omitted, and differences between the semiconductor package 100c in FIGS. 6, 7A, and 7B and the semiconductor package 100a in FIGS. 1, 2A, and 2B will mainly be described.

The semiconductor package 100c according to the example embodiment may include a circuit substrate 110, an insulating layer 111, a plurality of chip units 120, an underfill 130, a plurality of bumps 140, a plurality of first dams 150c, a plurality of second dams 150d, a plurality of conductive wires 160, and a plurality of pads 170. Each of the plurality of chip units 120 may be formed by stacking a plurality of first and second chips 120a and 120b.

The plurality of pads 170 may be disposed on an entire surface of the circuit substrate 110. For example, a plurality of first pads 170a of the plurality of pads 170 may be disposed in a central portion of the circuit substrate 110 to overlap a first chip 120a. A plurality of first pads 170a of the plurality of pads 170 may be disposed on the circuit substrate 110. The plurality of first pads 170a arranged in a first direction. A plurality of second pads 170b of the plurality of pads 170 may be disposed on both edge portions of the circuit substrate 110 in an Y-axial direction. Alternatively, the plurality of second pads 170b may be disposed on both edge portions of the circuit substrate 110 in a X-axial direction. The plurality of bumps 140 may be disposed on the circuit substrate 110 and electrically connecting the circuit substrate 110 and the first chip 120a. The underfill 130 may be fills a space between the circuit substrate 110 and the first chip 120a.

The first chip 120a may be electrically connected to the plurality of first pads 170a, which are disposed in the central portion of the circuit substrate 110, through a plurality of bumps 140. For example, the plurality of first pads 170a, which overlap the first chip 120a, may be electrically connected to the first chip 120a.

The second chip 120b may be mounted on the first chip 120a. A second chip 120b may be electrically connected to the plurality of second pads 170b, which are disposed on the edge portions of the circuit substrate 110, through the plurality of conductive wires 160. The plurality of second pads 170b may be disposed on an edge portion of the circuit substrate 110 and arranged in the second direction. The plurality of second pads 170b may not overlap the first chip 120a. The plurality of second pads 170b may be electrically connected to the second chip 120b through the plurality of conductive wires 160.

The first dam 150c may be disposed on the circuit substrate 110 and extending in a second direction substantially perpendicular to the first direction, at least a portion of the first dam 150c overlapping the first chip 120a. The second dam 150d may be disposed adjacent to the first dam 150c and extending in the second direction on the circuit substrate 110. The second dam 150d may be overlapping the first chip 120a. The first dam 150c and the second dam 150d may be disposed in parallel on a first surface (e.g., a top surface) of the circuit substrate 110. For example, the first dam 150c may have a height corresponding to about 50% to 95% of a height of a gap between the circuit substrate 110 and the first chip 120a. The second dam 150d may have a height corresponding to about 50% to 95% of the height of the gap between the circuit substrate 110 and the first chip 120a.

The first dam 150c and the second dam 150d may have the same height. Alternatively, the first dam 150c and the second dam 150d may have different heights from each other. For example, when the first dam 150c and the second dam 150d have the different heights, the second dam 150d may have a greater height than the first dam 150c. Alternatively, the first dam 150c may have a greater height than the second dam 150d.

The first dam 150c and the second dam 150d may be disposed on the circuit substrate 110 to overlap an edge portion of one side of the first chip 120a. FIG. 6 illustrates the first dam 150c and the second dam 150d on an edge portion of one side of the circuit substrate 110 in the X-axial direction. For example, the first dam 150c and the second dam 150d may parallelly extend in the Y-axial direction. Alternatively, the first dam 150c and the second dam 150d may be disposed on an edge portion of one side of the circuit substrate 110 in the Y-axial direction.

FIG. 6 illustrates an example in which the first dam 150c and the second dam 150d are disposed on the circuit substrate 110 to overlap both edge portions of the first chip 120a in the X-axial direction. Alternatively, the first dam 150c and the second dam 150d may be disposed on the circuit substrate 110 to overlap both edge portions of the first chip 120a in the Y-axial direction. For example, each of the first dam 150c and the second dam 150d may be disposed in an "I" form under the first chip 120a so that the first dam 150c and the second dam 150d may not be exposed beyond the first chip 120a when the semiconductor package 100c is viewed from above.

The first chip 120a and the circuit substrate 110 may be connected to each other through the plurality of bumps 140. The first dam 150c and the second dam 150d may be disposed outside the plurality of bumps 140. For example, the first dam 150c and the second dam 150d may be disposed beyond an outermost bump 140 of the plurality of bumps 140.

The first dam 150c may be disposed inside the second dam 150d on the circuit substrate 110. For example, the second dam 150d may be disposed outside the first dam 150c. The first dam 150c and the second dam 150d may be spaced apart from each other by a predetermined distance. For example, the first dam 150c and the second dam 150d may extend in parallel in a double blocking manner. For example, the first dam 150c and the second dam 150d may parallelly extend in the same direction. When a position of the bump 140 is changed to be closer to the central portion of the circuit substrate 110, positions of the first dam 150c and the second dam 150d may also be changed to be closer to the central portion of the circuit substrate 110.

According to the example embodiment, the first dam 150c and the second dam 150d in the semiconductor package 100c may be arranged in a double blocking manner to overlap an edge portion of one side of the first chip 120a and prevent the underfill 130 from flowing out toward an edge portion of the circuit substrate 110. For example, the underfill 130 may not flow out toward the edge portion of the circuit substrate 110 on which the plurality of second pads 170b are disposed. The plurality of second pads 170b, which are disposed on the edge portion of the circuit substrate 110, may not be contaminated or covered by the underfill 130. The plurality of second pads 170b may be formed in a region adjacent to the plurality of first and second chips 120a and 120b so that a size of the semiconductor package 100c may be reduced. For example, the size of the semiconductor package 100c may be reduced, because the plurality of conductive wires 160 connect between the plurality of second chips 120b and some of the plurality of second pads 170b that are the closest to the plurality of second chips 120b and do not overlap the plurality of second chips 120b.

Figure 8:
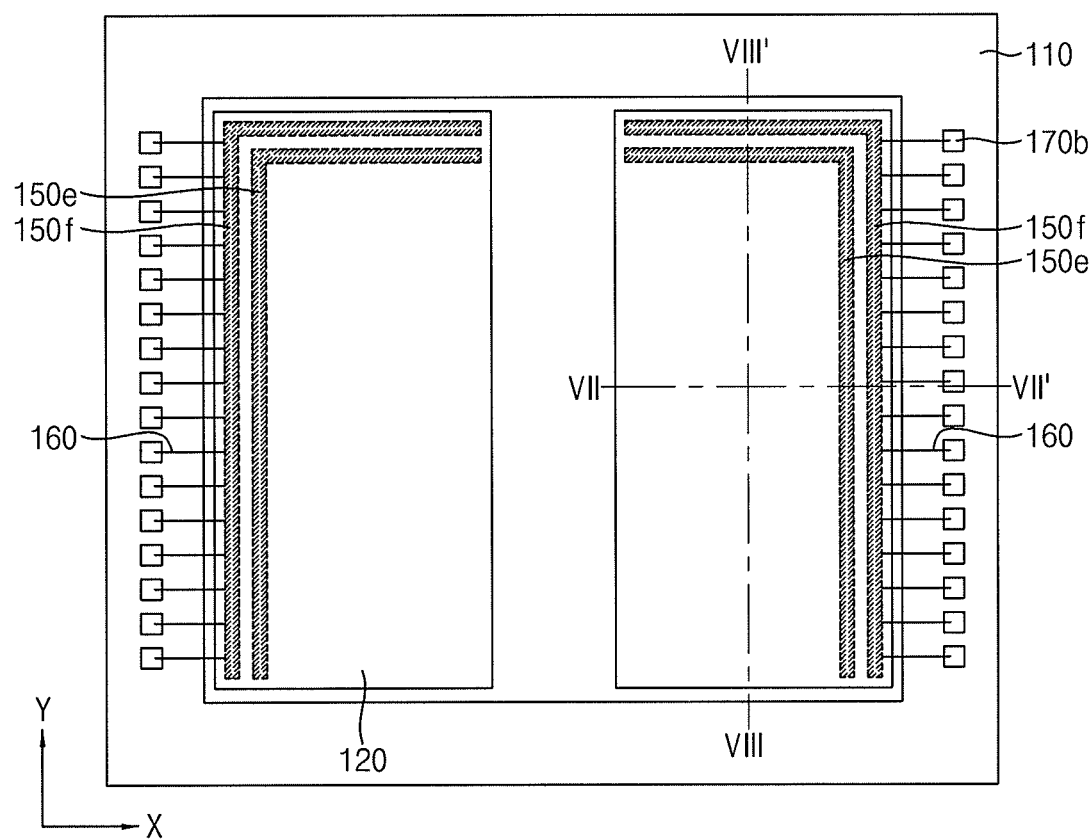
FIG. 8 illustrates a plan view of a semiconductor package 100d according to an example embodiment.
Figure 9A:
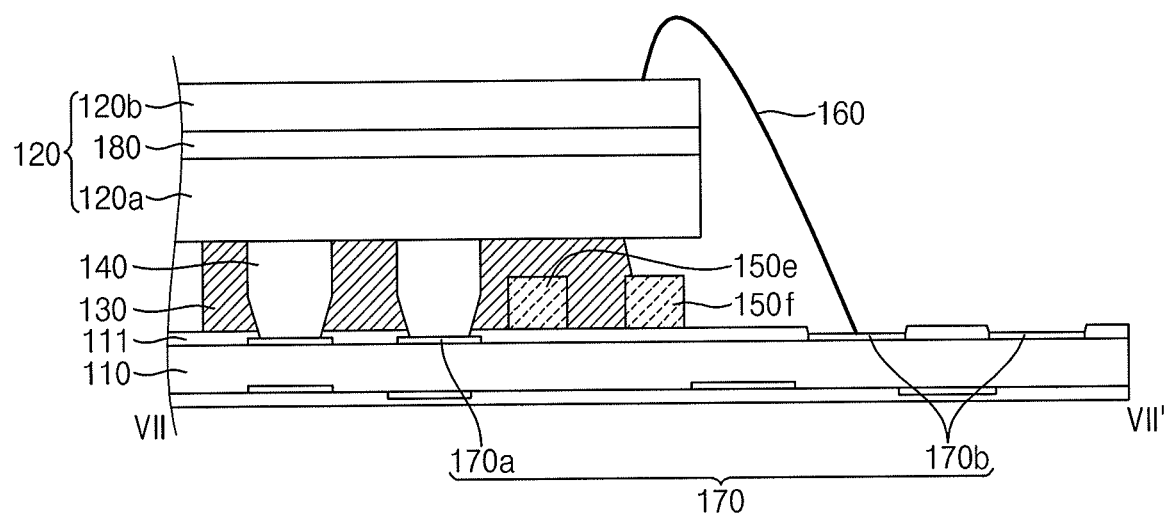
FIG. 9A illustrates a cross-sectional view taken along line VII-VII' in FIG. 8.
Figure 9B:
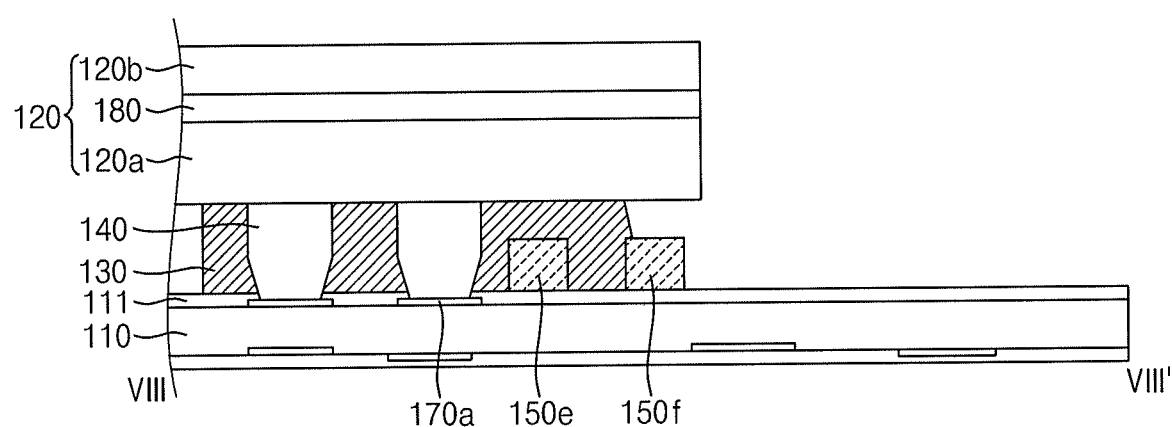
FIG. 9B illustrates a cross-sectional view taken along line VIII-VIII' in FIG. 8.

FIG. 8 illustrates a plan view of a semiconductor package 100d according to an example embodiment. FIG. 9A illustrates a cross-sectional view taken along line VII-VII' in FIG. 8. FIG. 9B illustrates a cross-sectional view taken along line VIII-VIII' in FIG. 8.

The semiconductor package 100d according to the example embodiment will be described with reference to FIGS. 8, 9A, and 9B. Descriptions of the same components as those of the semiconductor package 100a shown in FIGS. 1, 2A, and 2B may be omitted, and differences between the semiconductor package 100d in FIGS. 8, 9A, and 9B and the semiconductor package 100a in FIGS. 1, 2A, and 2B will mainly be described.

The semiconductor package 100d according to the example embodiment may include a circuit substrate 110, an insulating layer 111, a plurality of chip units 120, an underfill 130, a plurality of bumps 140, a plurality of first dams 150e, a plurality of second dams 150f, a plurality of conductive wires 160, and a plurality of pads 170. Each of the plurality of chip units 120 may be formed by stacking a plurality of first and second chips 120a and 120b.

The plurality of pads 170 may be disposed on an entire surface of the circuit substrate 110. For example, a plurality of first pads 170a of the plurality of pads 170 may be disposed in a central portion of the circuit substrate 110 to overlap a first chip 120a. A plurality of second pads 170b of the plurality of pads 170 may be disposed on both edge portions of the circuit substrate 110 in an X-axial direction. Alternatively, the plurality of second pads 170b may be disposed on both edge portions of the circuit substrate 110 in a Y-axial direction.

The first chip 120a may be electrically connected to the plurality of first pads 170a, which are disposed in the central portion of the circuit substrate 110, through the plurality of bumps 140. For example, the plurality of first pads 170a that overlap the first chip 120a, may be electrically connected to the first chip 120a.

A second chip 120b may be electrically connected to the plurality of second pads 170b, which are disposed on the edge portions of the circuit substrate 110, through the plurality of conductive wires 160. For example, the plurality of second pads 170b may not overlap the first chip 120a. The plurality of second pads 170b may be electrically connected to the second chip 120b through the plurality of conductive wires 160.

The first dam 150e and the second dam 150f may be disposed in parallel on a first surface (e.g., a top surface) of the circuit substrate 110. For example, the first dam 150e may have a height corresponding to about 50% to 95% of a height of a gap between the circuit substrate 110 and the first chip 120a. The second dam 150f may have a height corresponding to about 50% to 95% of the height of the gap between the circuit substrate 110 and the first chip 120a. The first dam 150e and the second dam 150f may have the same height. For example, the first dam 150e and the second dam 150f may have different heights. When the first dam 150e and the second dam 150f have the different heights, the second dam 150f may have a greater height than the first dam 150e. Alternatively, the first dam 150e may have a greater height than the second dam 150f.

The first dam 150e and the second dam 150f may be disposed on the circuit substrate 110 to overlap a plurality of edge portions of the first chip 120a. FIG. 8 illustrates an example in which the first dam 150e and the second dam 150f are disposed on the circuit substrate 110 to overlap two edge portions of the first chip 120a. For example, the first dam 150e and the second dam 150f may overlap three edge portions of the first chip 120a.

For example, the first dam 150e and the second dam 150f may be disposed on the circuit substrate 110 in a "¬" shape to overlap two edge portions of the first chip 120a. For example, the first dam 150e and the second dam 150f may be disposed on the circuit substrate 110 to overlap an edge portion of one side of the first chip 120a and may extend in the X-axial direction in parallel. Alternatively, the first dam 150e and the second dam 150f may be disposed on the circuit substrate 110 to overlap an edge portion of one side of the first chip 120a and may extend in the Y-axial direction in parallel.

As each of the first dam 150e and the second dam 150f is disposed in the "¬" shape under the first chip 120a, the first dam 150e and the second dam 150f may not be exposed beyond the first chip 120a when the semiconductor package 100b is viewed from above.

The plurality of bumps 140 may electrically connect between the circuit substrate 110 and the first chip 120a. The first dam 150e and the second dam 150f may be disposed outside the plurality of bumps 140. For example, the first dam 150e and the second dam 150f may be disposed beyond an outermost bump 140 of the plurality of bumps 140.

The first dam 150e may be disposed inside the second dam 150f on the circuit substrate 110. For example, the second dam 150f may be disposed outside the first dam 150e. The first dam 150e and the second dam 150f may be spaced apart from each other by a predetermined distance. Thus, the first dam 150e and the second dam 150f may extend in parallel in a double blocking manner. When a position of the bump 140 is changed to be closer to the central portion of the circuit substrate 110, positions of the first dam 150e and the second dam 150f may also be changed to be closer to the central portion of the circuit substrate 110.

According to the example embodiment, the first dam 150e and the second dam 150f in the semiconductor package 100d may extend in a double blocking manner to overlap an edge portion of one side of the first chip 120a and prevent the underfill 130 from flowing out toward an edge portion of the circuit substrate 110. For example, the underfill 130 may not flow out toward the edge portion of the circuit substrate 110 on which the plurality of second pads 170b are disposed. The plurality of second pads 170b, which are disposed on the edge portion of the circuit substrate 110, may not be contaminated or covered by the underfill 130. The plurality of second pads 170b may be formed in a region adjacent to the plurality of first and second chips 120a and 120b so that a size of the semiconductor package 100d may be reduced. For example, the size of the semiconductor package 100d may be reduced, because the plurality of conductive wires 160 connect between the plurality of second chips 120b and some of the plurality of second pads 170b that are the closest to the plurality of second chips 120b and do not overlap the plurality of second chips 120b.

Figure 10:
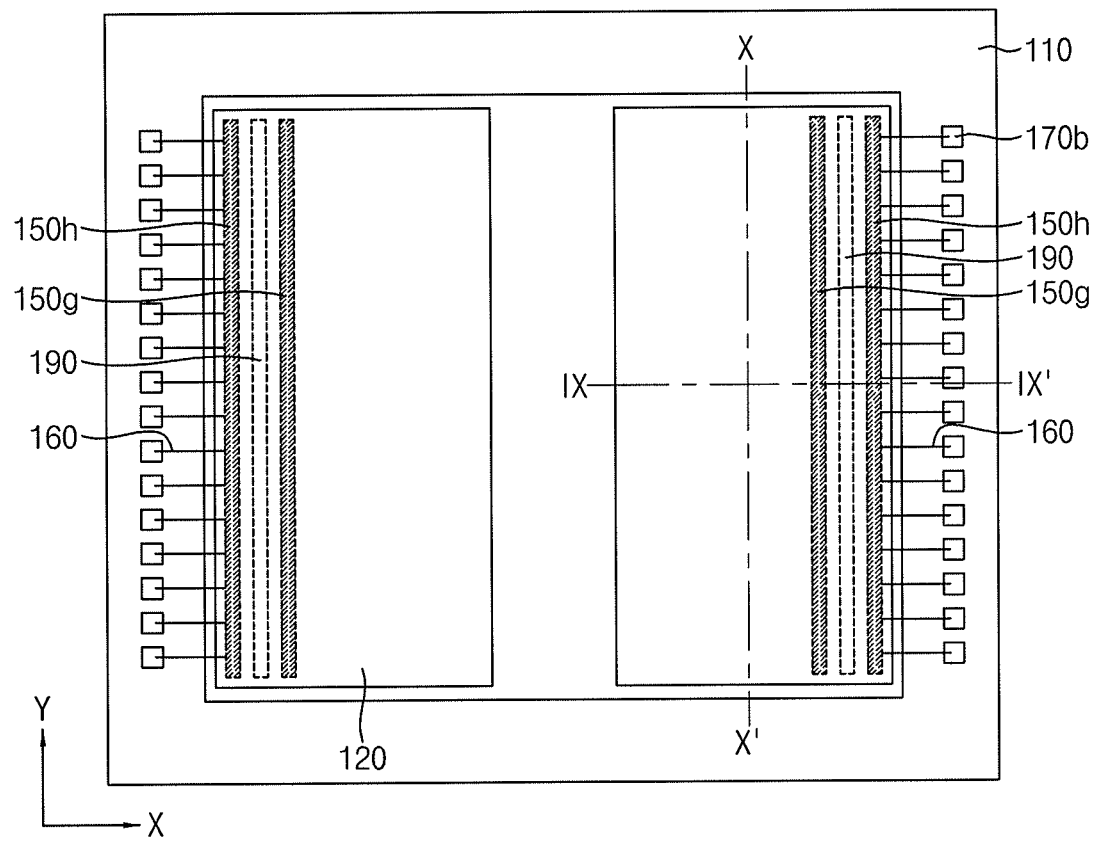
FIG. 10 illustrates a plan view of a semiconductor package 100e according to an example embodiment.
Figure 11A:
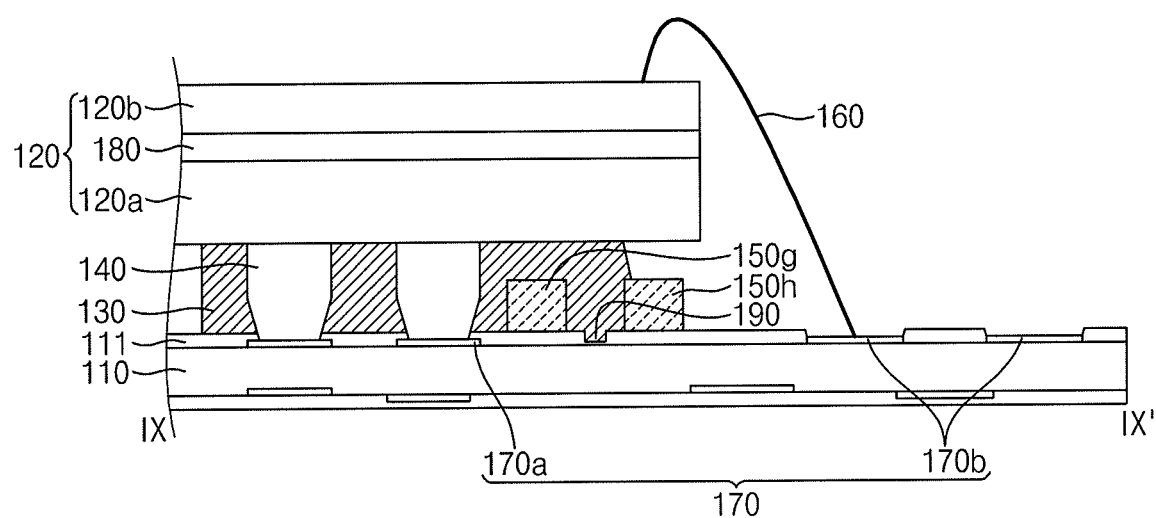
FIG. 11A illustrates a cross-sectional view taken along line IX-IX' in FIG. 10.
Figure 11B:
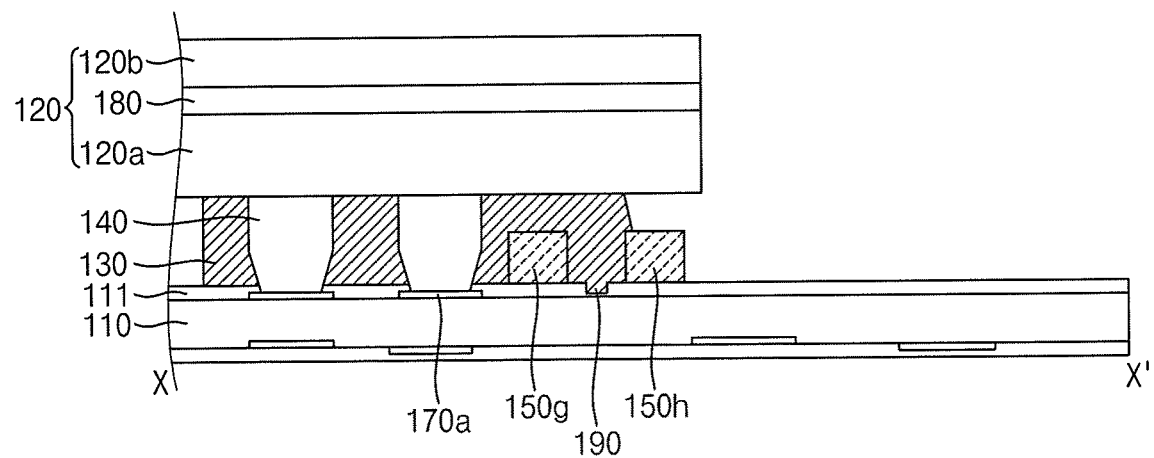
FIG. 11B illustrates a cross-sectional view taken along line X-X' in FIG. 10.

FIG. 10 illustrates a plan view of a semiconductor package 100e according to an example embodiment. FIG. 11A illustrates a cross-sectional view taken along line IX-IX' in FIG. 10. FIG. 11B illustrates a cross-sectional view taken along line X-X' in FIG. 10.

The semiconductor package 100e according to the example embodiment will be described with reference to FIGS. 10, 11A, and 11B. Descriptions of the same components as those of the semiconductor package 100a shown in FIGS. 1, 2A, and 2B may be omitted, and differences between the semiconductor package 100e in FIGS. 10, 11A, and 11B and the semiconductor package 100a in FIGS. 1, 2A, and 2B will mainly be described.

The semiconductor package 100e according to the example embodiment may include a circuit substrate 110, an insulating layer 111, a plurality of chip units 120, an underfill 130, a plurality of bumps 140, a plurality of first dams 150g, a plurality of second dams 150h, a plurality of conductive wires 160, and a plurality of pads 170. Each of the plurality of chip units 120 may be formed by stacking a plurality of first and second chips 120a and 120b.

The plurality of pads 170 may be disposed on an entire surface of the circuit substrate 110. As an example, a plurality of first pads 170a of the plurality of pads 170 may be disposed in a central portion of the circuit substrate 110 to overlap a lower portion of the first chip 120a.

A plurality of second pads 170b of the plurality of pads 170 may be disposed on both edge portions of the circuit substrate 110 in an X-axial direction. Alternatively, the plurality of second pads 170b may be disposed on both edge portions of the circuit substrate 110 in a Y-axial direction.

The first chip 120a may be electrically connected to the plurality of first pads 170a, which are disposed in the central portion of the circuit substrate 110, through the plurality of bumps 140. For example, the plurality of first pads 170a that overlap the first chip 120a may be electrically connected to the first chip 120a.

The second chip 120b may be electrically connected to the plurality of second pads 170b, which are disposed on the edge portions of the circuit substrate 110, through the plurality of conductive wires 160. For example, the plurality of second pads 170b may not overlap the first chip 120a. The plurality of second pads 170b may be electrically connected to the second chip 120b through the plurality of conductive wires 160.

The first dam 150g and the second dam 150h may be disposed in parallel on a first surface of the circuit substrate 110. For example, the first dam 150g may have a height corresponding to about 50% to 95% of a height of a gap between the circuit substrate 110 and the first chip 120a. The second dam 150h may have a height corresponding to about 50% to 95% of the height of the gap between the circuit substrate 110 and the first chip 120a. The first dam 150g may have the same height as the second dam 150h. For example, the first dam 150g and the second dam 150h may have different heights. When the first dam 150g and the second dam 150h have the different heights, the second dam 150h may have a greater height than the first dam 150g. Alternatively, the first dam 150g may have a greater height than the second dam 150h.

The first dam 150g and the second dam 150h may be disposed on the circuit substrate 110 to overlap a plurality of edge portions of the first chip 120a. FIG. 10 illustrates an example in which the first dam 150g and the second dam 150h are disposed on the circuit substrate 110 to overlap one edge portion of the first chip 120a. For example, the first dam 150g and the second dam 150h may overlap two or three edge portions of the first chip 120a.

As an example, the first dam 150g and the second dam 150h may be disposed in a "¬" shape on the circuit substrate 110 to overlap two edge portions of the first chip 120a. For example, the first dam 150g and the second dam 150h may be disposed on the circuit substrate 110 to overlap both edge portions of the first chip 120a that face in the X-axial direction. Alternatively, the first dam 150g and the second dam 150h may be disposed on the circuit substrate 110 to overlap both edge portions of the first chip 120a that face in the Y-axial direction.

As each of the first dam 150g and the second dam 150h is disposed in the "¬" shape under the first chip 120a, the first dam 150e and the second dam 150f may not be exposed beyond the first chip 120a when the semiconductor package 100e is viewed from above.

The plurality of bumps 140 may electrically connect between the circuit substrate 110 and the first chip 120a. The first dam 150g and the second dam 150h may be disposed outside the plurality of bumps 140. For example, the first dam 150g and the second dam 150h may be disposed beyond an outermost bump 140 of the plurality of bumps 140.

The first dam 150g may be disposed inside the second dam 150h on the circuit substrate 110. For example, the second dam 150h may be disposed outside the first dam 150g. The first dam 150g and the second dam 150h may be spaced apart from each other by a predetermined distance. Thus, the first dam 150g and the second dam 150h may extend in parallel in a double blocking manner. When a position of the bump 140 is changed to be closer to the central portion of the circuit substrate 110, positions of the first dam 150g and the second dam 150h may also be changed be closer to the central portion of the circuit substrate 110.

A trench 190 may have a predetermined depth and may be between the first dam 150g and the second dam 150h. The trench 190 may have the predetermined depth by etching the first surface of the circuit substrate 110. For example, the trench 190 may be formed by etching the insulating layer 111. The trench 190 may be formed in an "I" shape in a manner similar to the first dam 150g and the second dam 150h. For example, the trench, the first dam 150g, and the second dam 150h may extend in parallel in the same direction. The trench 190 may overlap an edge portion of the first chip 120a. When the first dam 150g and the second dam 150h are provided in a "¬" shape, the trench 190 may also be provided in a "¬" shape in a similar manner. Thus, the trench 190 may be disposed between the first dam 150g and the second dam 150h to parallel thereto. When a position of the bump 140 is changed to be closer to the central portion of the circuit substrate 110, a position of the trench 190 may also be changed to be closer to the central portion of the circuit substrate 110.

The trench 190 may have a predetermined depth between the first dam 150g and the second dam 150h, which are disposed in a double blocking manner, so that the underfill 130 may not flow toward the edge portion of the circuit substrate 110. For example, when the underfill 130 overflows the first dam 150g, the overflowed underfill 130 may be blocked by the trench 190 so that the edge portion of the circuit substrate 110 may not be contaminated or covered by the underfill 130. Further, when the underfill 130 overflows the trench 190, the overflowed underfill 130 may be blocked by the second dam 150h so that the edge portion of the circuit substrate 110 may not be contaminated or covered by the underfill 130.

According to the example embodiment, the first dam 150g and the second dam 150h in the semiconductor package 100d may be arranged in a double blocking manner to overlap an edge portion of one side of the first chip 120a, and the trench 190 may be disposed between the first dam 150g and the second dam 150h, thereby preventing the underfill 130 from flowing out toward an edge portion of the circuit substrate 110. For example, the first dam 150g and the second dam 150h may extend in parallel in the same direction. For example, the underfill 130 may not flow out toward the edge portion of the circuit substrate 110 on which the plurality of second pads 170b are disposed. The plurality of second pads 170b, which are disposed on the edge portion of the circuit substrate 110, may not be contaminated or covered by the underfill 130. Thus, the flow of the underfill 130 may be blocked by the trench 190, the first dam 150g, and the second dam 150h (e.g., in a triple blocking manner) such that the edge portion of the circuit substrate 110 may not be contaminated or covered by the underfill 130. The plurality of second pads 170b may be formed in a region adjacent to the plurality of first and second chips 120a and 120b so that a size of the semiconductor package 100d may be reduced. For example, the size of the semiconductor package 100d may be reduced, because the plurality of conductive wires 160 connect between the plurality of second chips 120b and some of the plurality of second pads 170b that are the closest to the plurality of second chips 120b and do not overlap the plurality of second chips 120b.

Figure 12:
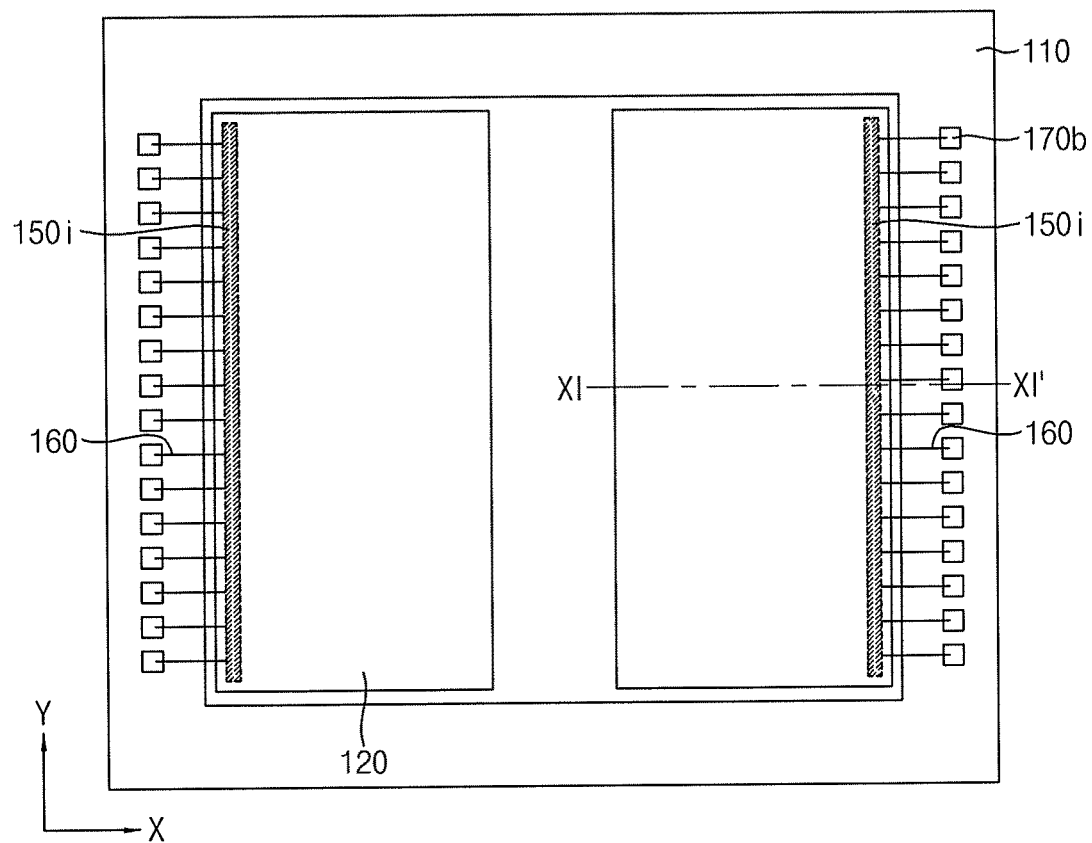
FIG. 12 illustrates a semiconductor package 100f according to an example embodiment.
Figure 13:
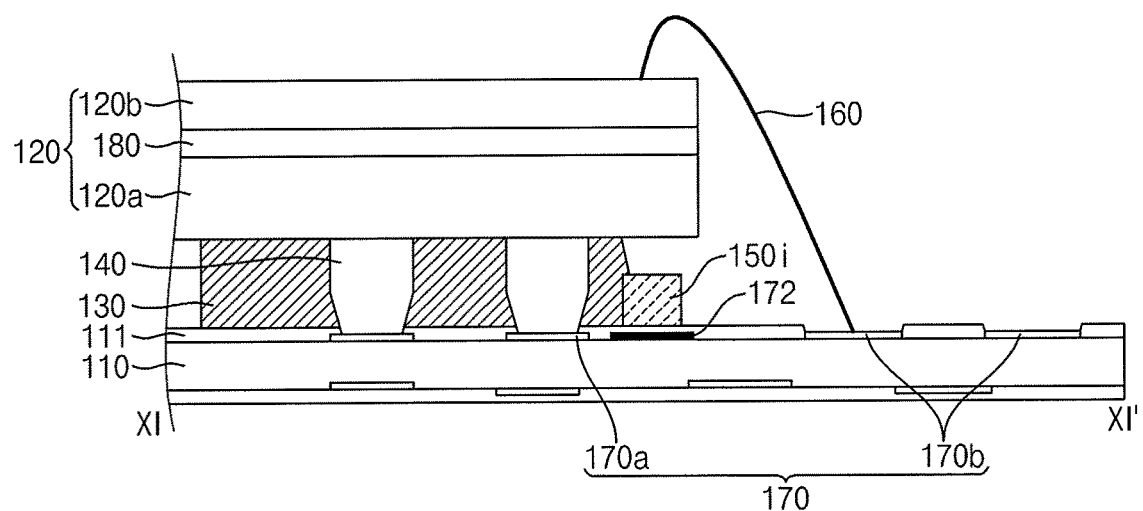
FIG. 13 illustrates a cross-sectional view taken along line XI-XI' in FIG. 12.

FIG. 12 illustrates a semiconductor package 100f according to an example embodiment. FIG. 13 illustrates a cross-sectional view taken along line XI-XI' in FIG. 12.

The semiconductor package 100f according to the example embodiment will be described with reference to FIGS. 12 and 13. Descriptions of the same components as those of the semiconductor package 100a shown in FIGS. 1, 2A, and 2B may be omitted, and differences between the semiconductor package 100f in FIGS. 12 and 13 and the semiconductor package 100a in FIGS. 1, 2A, and 2B will mainly be described.

The semiconductor package 100f according to the example embodiment may include a circuit substrate 110, an insulating layer 111, a plurality of chip units 120, an underfill 130, a plurality of bumps 140, a plurality of dams 150i, a plurality of conductive wires 160, and a plurality of pads 170. Each of the plurality of chip units 120 may be formed by stacking a plurality of first and second chips 120a and 120b.

A plurality of pads 170 may be disposed on the circuit substrate 110 and electrically connected to a first chip 120a and a second chip 120b. The plurality of pads 170 may be disposed on an entire surface of the circuit substrate 110. A plurality of interconnections 172 may be disposed on the circuit substrate 110. The plurality of interconnections 172 may include signal interconnections and power interconnections, e.g., a VDD line, a VSS line, and a GND line. The insulating layer 111 may be formed on the circuit substrate 110 to cover the plurality of interconnections 172. The insulating layer 111 may be removed from a region in which the plurality of pads 170 are formed so that the plurality of pads 170 may be exposed to the outside.

The dam 150i may be formed on a first surface of the circuit substrate 110 and have a predetermined height. For example, the dam 150i may have a height corresponding to about 50% to 95% of a height of a gap between the circuit substrate 110 and the first chip 120a.

The dam 150i may be disposed on the circuit substrate 110 to overlap an edge portion of one side of the first chip 120a. FIG. 12 illustrates the dam 150i formed to overlap one edge portion of the first chip 120a. For example, the dam 150i may overlap two edge portions of the first chip 120a according to a shape in which the interconnection 172 is disposed. When the dam 150i overlaps the two edge portions of the first chip 120a, the dam 150i may be formed in a "¬" shape. For example, the dam 150i may overlap three edge portions of the first chip 120a according to the shape in which the interconnection 172 is disposed. For example, when the dam 150i overlaps the three edge portions of the first chip 120a, the dam 150i may be formed in a "⊏" shape.

The plurality of bumps 140 may electrically connect between the circuit substrate 110 and the first chip 120a. The dam 150i may be disposed outside the plurality of bumps 140. For example, the dam 150i may be disposed beyond an outermost bump 140 of the plurality of bumps 140.

The dam 150i may be formed by adhering a conductive film to the first surface of the circuit substrate 110. For example, the dam 150i may be formed of a resin liquid containing a conductive material. The dam 150i may have conductivity and may overlap at least one of the plurality of interconnections 172 on the circuit substrate 110.

In an example embodiment, the dam 150i may have conductivity and may be disposed to overlap the VDD line with the insulating layer 111 disposed therebetween. For example, the dam 150i may have conductivity and may overlap the VSS line with the insulating layer 111 disposed therebetween. For example, the dam 150i may have conductivity and may overlap the GND line with the insulating layer 111 disposed therebetween. For example, the dam 150i may have conductivity and may overlap the signal interconnections with the insulating layer 111 disposed therebetween.

As described above, the dam 150i having conductivity may overlap an arbitrary interconnection, e.g., one of the plurality of interconnections 172 in the circuit substrate 110, to form a capacitor between the dam 150i and the arbitrary interconnection. For example, an underfill resin liquid may not flow out to the edge portion of the circuit substrate 110 by the dam 150i having conductivity.

Noise may be generated by signals transmitting through the plurality of interconnections 172 on the circuit substrate 110 or by a high-frequency component of a power source. For example, the noise may be eliminated or reduced by the capacitor between the dam 150i and the arbitrary interconnection. Thus, the capacitor may be formed using the dam 150i having conductivity, thereby eliminating or reducing noise in a high-frequency region.

Figure 14:
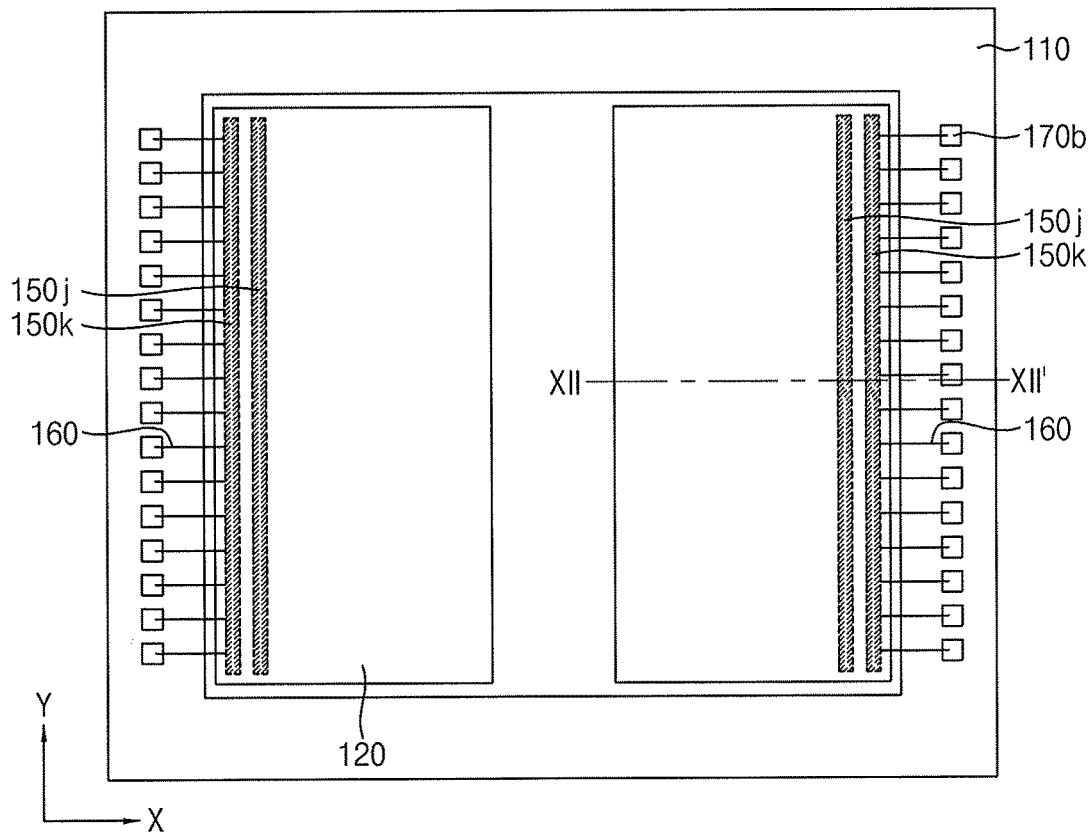
FIG. 14 illustrates a semiconductor package 100g according to an example embodiment.
Figure 15:
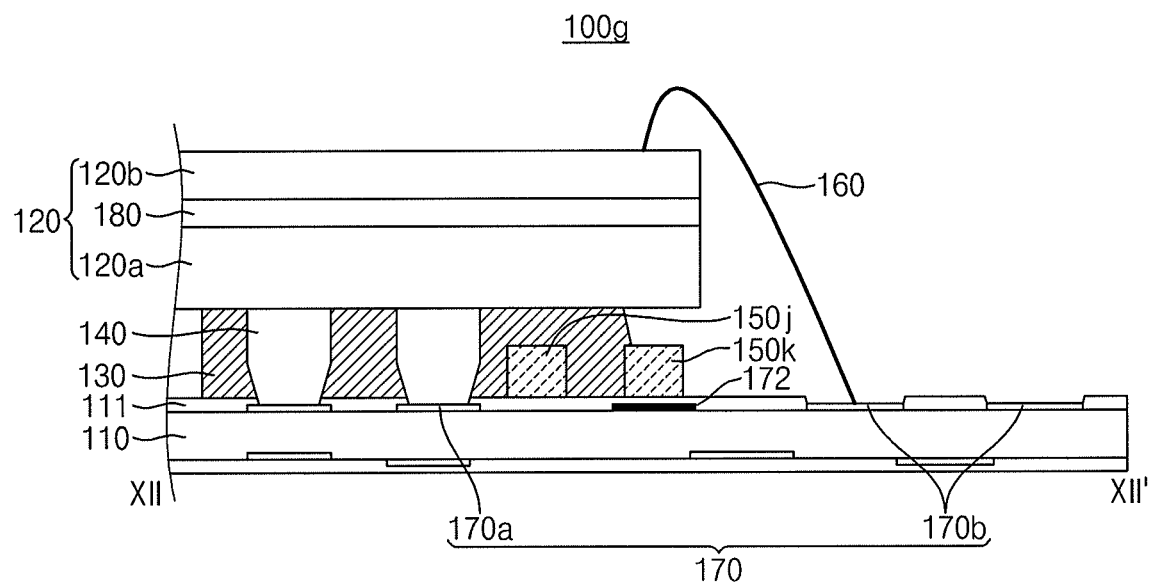
FIG. 15 illustrates a cross-sectional view taken along line XII-XII' in FIG. 14.

FIG. 14 illustrates a semiconductor package 100g according to an example embodiment. FIG. 15 illustrates a cross-sectional view taken along line XII-XII' in FIG. 14.

The semiconductor package 100g according to the example embodiment will be described with reference to FIGS. 14 and 15. Descriptions of the same components as those of the semiconductor package 100a shown in FIGS. 1, 2A, and 2B may be omitted, and differences between the semiconductor package 100g in FIGS. 14 and 15 and the semiconductor package 100a in FIGS. 1, 2A, and 2B will mainly be described.

The semiconductor package 100g according to the example embodiment may include a circuit substrate 110, an insulating layer 111, a plurality of chip units 120, an underfill 130, a plurality of bumps 140, a plurality of first dams 150j, a plurality of second dams 150k, a plurality of conductive wires 160, and a plurality of pads 170. Each of the plurality of chip units 120 may be formed by stacking a plurality of first and second chips 120a and 120b.

A plurality of pads 170 may be disposed on the circuit substrate 110 and electrically connect between a first chip 120a and a second chip 120b. The plurality of pads 170 may be disposed on an entire surface of the circuit substrate 110. A plurality of interconnections 172 may be disposed on the circuit substrate 110. The plurality of interconnections 172 may include signal interconnections and power interconnections, e.g., a VDD line, a VSS line, and a GND line. The insulating layer 111 may be formed on the circuit substrate 110 to cover the plurality of interconnections 172.

A first dam 150j and a second dam 150k may be arranged in an "I" form in parallel on a first surface of the circuit substrate 110. For example, the first dam 150j and the second dam 150k may have a height corresponding to about 50% to 95% of a height of a gap between the circuit substrate 110 and the first chip 120a.

The first dam 150j and the second dam 150k may have the same height. For example, the first dam 150j and the second dam 150k may have different heights. When the first dam 150j and the second dam 150k have the different heights, the second dam 150k may have a greater height than the first dam 150j. Alternatively, the first dam 150j may have a greater height than the second dam 150k.

The first dam 150j and the second dam 150k may be disposed on the circuit substrate 110 to overlap an edge portion of one side of the first chip 120a. FIG. 14 illustrates the first dam 150j and the second dam 150k on an edge portion of one side of the circuit substrate 110 that face in an X-axial direction. For example, the first dam 150j and the second dam 150k may be disposed on an edge portion of one side of the circuit substrate 110 that face in a Y-axial direction.

The plurality of bumps 140 may electrically connect the circuit substrate 110 and the first chip 120a. The first dam 150j and the second dam 150k may be disposed outside the plurality of bumps 140. For example, the first dam 150j and the second dam 150k may be disposed beyond an outermost bump 140 of the plurality of bumps 140.

The first dam 150j and the second dam 150k may be spaced apart from each other by a predetermined distance. Thus, the first dam 150j and the second dam 150k may be arranged in parallel in a double blocking manner. When a position of the bump 140 is changed to be closer to the central portion of the circuit substrate 110, positions of the first dam 150j and the second dam 150k may also be changed to be closer to the central portion of the circuit substrate 110.

Referring to FIGS. 14 and 15, as described above, the first dam 150j may be disposed inside the second dam 150k. Alternatively, the second dam 150k may be disposed inside the first dam 150j.

The first dam 150j may be formed of a material including at least one of, e.g., epoxy resin, phenol resin, and a silicone series. For example, the first dam 150j may be formed of a first solution containing 40% epoxy resin and 10% silicone. For example, the first dam 150j may be formed by variously combined materials that may be sprayed using a nozzle.

The second dam 150k may be formed by adhering a conductive film to the first surface of the circuit substrate 110. For example, the second dam 150k may be formed of a resin liquid containing a conductive material. The second dam 150k having conductivity may overlap at least one of the plurality of interconnections 172 on the circuit substrate 110.

In an example embodiment, the second dam 150k having conductivity may overlap the VDD line with the insulating layer 111 disposed therebetween. In and example embodiment, the second dam 150k having conductivity may overlap the VSS line with the insulating layer 111 disposed therebetween. In an example embodiment, the second dam 150k having conductivity may overlap the GND line with the insulating layer 111 disposed therebetween. In an example embodiment, the second dam 150k having conductivity may be disposed to overlap the signal interconnection with the insulating layer 111 disposed therebetween.

As described above, the second dam 150k having conductivity may overlap an arbitrary interconnection, e.g., one of the plurality of interconnections 172 in the circuit substrate 110, to form a capacitor between the second dam 150k and the arbitrary interconnection.

An underfill resin liquid may be prevented from flowing out to the edge portion of the circuit substrate 110 using the first dam 150j and the second dam 150k. Noise may be generated by signals transmitting through the plurality of interconnections 172 on the circuit substrate 110 or by a high-frequency component of a power source. For example, the noise may be eliminated or reduced by the capacitor between the second dam 150k and the arbitrary interconnection. Thus, the capacitor may be formed using the second dam 150k having conductivity, thereby eliminating or reducing noise in a high-frequency region.

Figure 16:
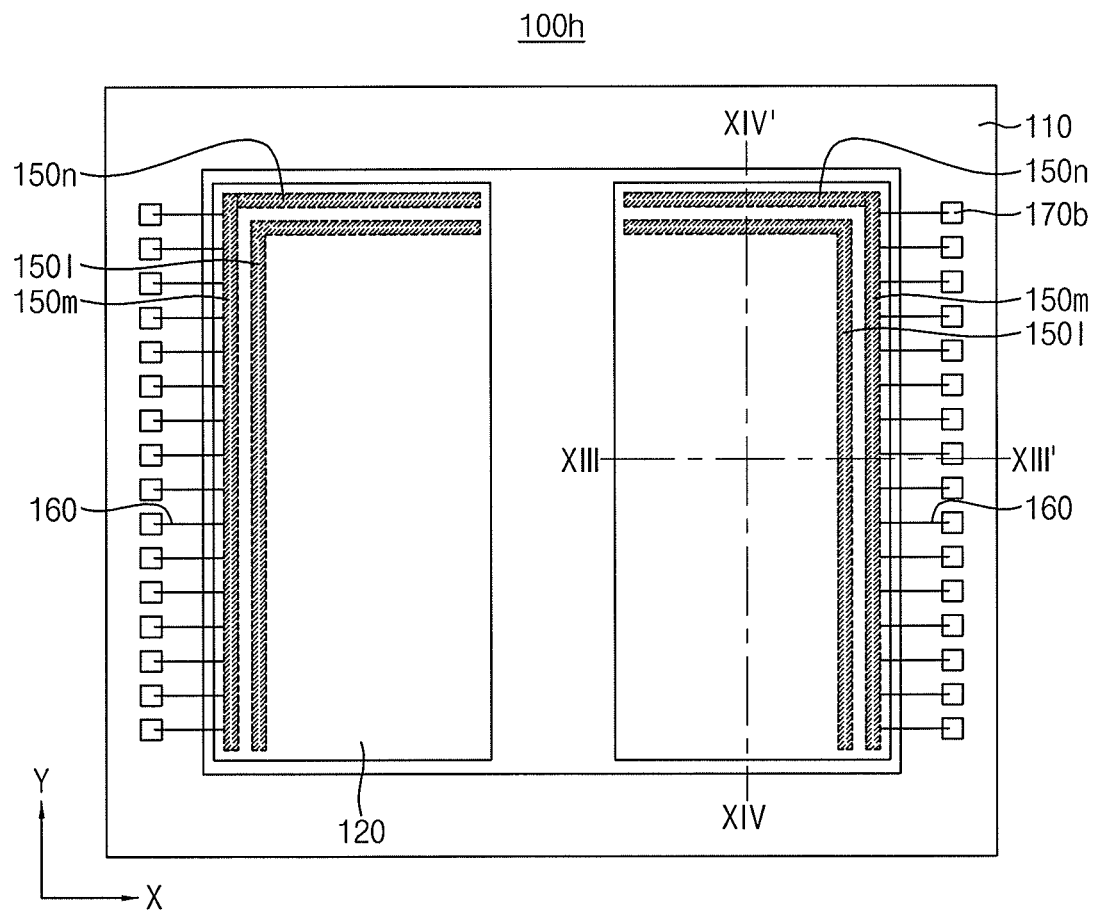
FIG. 16 illustrates a semiconductor package 100h according to an example embodiment.
Figure 17:
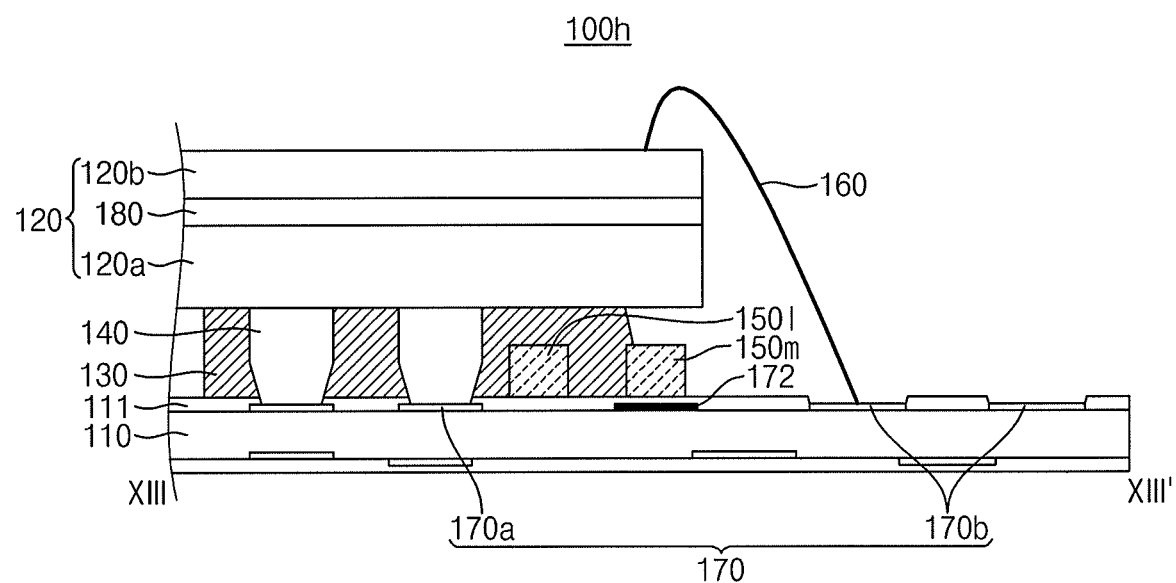
FIG. 17 illustrates a cross-sectional view taken along line XIII-XIII' in FIG. 16.
Figure 18:
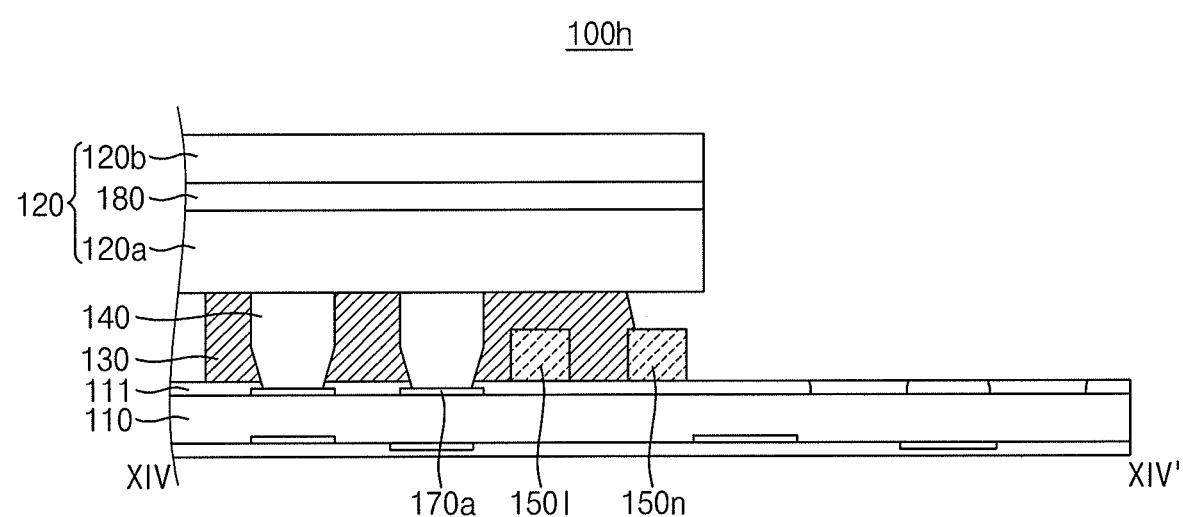
FIG. 18 illustrates a cross-sectional view taken along line XIV-XIV' in FIG. 16.

FIG. 16 illustrates a semiconductor package 100h according to an example embodiment. FIG. 17 illustrates a cross-sectional view taken along line XIII-XIII' in FIG. 16. FIG. 18 illustrates a cross-sectional view taken along line XIV-XIV' in FIG. 16.

The semiconductor package 100h according to the example embodiment will be described with reference to FIGS. 16, 17, and 18. Descriptions of the same components as those of the semiconductor package 100a shown in FIGS. 1, 2A, and 2B may be omitted, and differences between the semiconductor package 100h in FIGS. 16, 17, and 18 and the semiconductor package 100a in FIGS. 1, 2A, and 2B will mainly be described.

The semiconductor package 100h according to the example embodiment may include a circuit substrate 110, an insulating layer 111, a plurality of chip units 120, an underfill 130, a plurality of bumps 140, a plurality of first dams 150l, a plurality of second dams 150m, a plurality of third dams 150n, a plurality of conductive wires 160, and a plurality of pads 170. Each of the plurality of chip units 120 may be formed by stacking a plurality of first and second chips 120a and 120b.

A plurality of pads 170 may be disposed on a circuit substrate 110 and electrically connected to a first chip 120a and a second chip 120b. The plurality of pads 170 may be disposed on an entire surface of the circuit substrate 110. A plurality of interconnections 172 may be disposed on the circuit substrate 110. The plurality of interconnections 172 may include signal interconnections and power interconnections, e.g., a VDD line, a VSS line, and a GND line. The insulating layer 111 may be formed on the circuit substrate 110 to cover the plurality of interconnections 172.

The first dam 150l may be formed in a "¬" shape on a first surface of the circuit substrate 110. The second dam 150m may be formed in an "I" form outside the first dam 150l in an X-axial direction. The third dam 150n may be formed in a "–" shape outside the first dam 150l in a Y-axial direction.

The first dam 150l, the second dam 150m, and third dam 150n may have heights corresponding to about 50% to 95% of a height of a gap between the circuit substrate 110 and the first chip 120a. The first dam 150l, the second dam 150m, and the third dam 150n may have the same height. Alternatively, the first dam 150l, the second dam 150m, and the third dam 150n may have different heights.

The plurality of bumps 140 may electrically connect between the circuit substrate 110 and the first chip 120a. The first dam 150l, the second dam 150m, and the third dam 150n may be disposed outside the plurality of bumps 140. For example, the first dam 150l, the second dam 150m, the third dam 150n may be disposed beyond an outermost bump 140 of the plurality of bumps 140.

The first dam 150l and the second dam 150m may be spaced apart from each other by a predetermined distance. Further, the first dam 150l and the third dam 150n may be spaced apart from each other by a predetermined distance. The second dam 150m and the third dam 150n may be connected to each other outside the first dam 150l. When a position of the bump 140 is changed to be closer to the central portion of the circuit substrate 110, positions of the first dam 150l, the second dam 150m, and the third dam 150n may also be changed to be closer to the central portion of the circuit substrate 110.

The first dam 150l and the third dam 150n may be formed of a material including at least one of, e.g., epoxy resin, phenol resin, and a silicone series. For example, the first dam 150l and the third dam 150n may be formed of a first solution containing 40% epoxy resin and 10% silicone. For example, the first dam 150l and the third dam 150n may be formed by variously combined materials that may be sprayed using a nozzle.

The second dam 150m may be formed by adhering a conductive film to the first surface of the circuit substrate 110. For example, the second dam 150m may be formed of a resin liquid containing a conductive material. The second dam 150m having conductivity may overlap at least one of the plurality of interconnections 172 on the circuit substrate 110.

In an example embodiment, the second dam 150m having conductivity may overlap the VDD line with an insulating layer 111 therebetween. In an example embodiment, the second dam 150m having conductivity may overlap the VSS line with the insulating layer 111 therebetween. In an example embodiment, the second dam 150m having conductivity may be disposed to overlap the GND line with the insulating layer 111 therebetween. In an example embodiment, the second dam 150m having conductivity may overlap the signal interconnection with the insulating layer 111 therebetween.

As described above, the second dam 150m having conductivity may be disposed to overlap an arbitrary interconnection, e.g., one of the plurality of interconnections 172 in the circuit substrate 110, to form a capacitor between the second dam 150m and the arbitrary interconnection. For example, an underfill resin liquid may not flow out to the edge portion of the circuit substrate 110 by the first dam 150l, the second dam 150m, and the third dam 150n.

Noise may be generated by signals transmitting through the plurality of interconnections 172 on the circuit substrate 110 or by a high-frequency component of a power source. For example, the noise may be eliminated or reduced by the capacitor between the second dam 150m and the arbitrary interconnection. Thus, the capacitor may be formed using the second dam 150m having conductivity, thereby eliminating or reducing noise in a high-frequency region.

According to the example embodiments, an underfill may not flow out toward an edge portion of a circuit substrate on which a pad is disposed so that the edge portion of the circuit substrate may not be contaminated or covered by the underfill.

According to the example embodiments, a form factor of a semiconductor package can be reduced. According to the example embodiments, generation of noise due to a signal transmitting through a plurality of interconnections formed on a circuit substrate or a high-frequency component of a power source can be eliminated or reduced.

While the embodiments have been described with reference to the accompanying drawings, it should be understood by those skilled in the art that various modifications may be made without departing from the scope of the example embodiments and without changing essential features thereof. Therefore, the above-described embodiments should be considered in a descriptive sense only and not for purposes of limitation.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor package, comprising:
   a substrate including a plurality of interconnections;
   at least one chip on the substrate;
   a plurality of first pads on the substrate, the plurality of first pads overlapping the at least one chip;
   a plurality of bumps between the substrate and the at least one chip;
   a plurality of second pads on an edge portion of a first side of the substrate, the plurality of second pads being electrically connected to the at least one chip through a plurality of first conductive wires;
   an underfill that fills a space between the substrate and the at least one chip; and a first dam on the substrate, the first dam overlapping the at least one chip.

2. The semiconductor package as claimed in claim 1, further comprising an insulating layer between the first dam and at least one of the plurality of interconnections, such that the first dam and the at least one of the plurality of interconnections defining a capacitor.

3. The semiconductor package as claimed in claim 1, wherein the first dam has an "I" shape and overlaps one edge portion of the at least one chip.

4. The semiconductor package as claimed in claim 1, wherein the first dam is between the underfill and the plurality of second pads.

5. The semiconductor package as claimed in claim 1, wherein the first dam overlaps two edge portions of the at least one chip.

6. The semiconductor package as claimed in claim 5, further comprising a plurality of third pads on an edge portion of a second side of the substrate, the plurality of third pads being electrically connected to the at least one chip through a plurality of second conductive wires, and the first dam being between the underfill and the plurality of second pads and between the underfill and the plurality of third pads.

7. The semiconductor package as claimed in claim 1, further comprising:
   a second dam outside the first dam, the second dam overlapping the at least one chip; and
   a trench between the first dam and the second dam.

8. The semiconductor package as claimed in claim 7, wherein the trench, the first dam, and the second dam extend along a same edge portion of the at least one chip.

9. The semiconductor package as claimed in claim 7, wherein each of the first dam and the second dam has an "I" shape and overlaps the at least one chip, the trench extending in parallel with the first dam and the second dam.

10. The semiconductor package as claimed in claim 7, wherein the trench, the first dam, and the second dam overlap two opposite edge portions of the at least one chip.

11. The semiconductor package as claimed in claim 10, wherein each of the first dam and the second dam has a "¬" shape on the substrate, the trench extending in parallel with the first dam and the second dam.

12. A semiconductor package, comprising:
   a substrate including a plurality of interconnections;
   a first chip on the substrate;
   a plurality of first pads on the substrate, the plurality of first pads overlapping the first chip;
   a plurality of bumps between the substrate and the first chip;
   an underfill that fills a space between the substrate and the first chip;
   a first dam on the substrate, the first dam overlapping the first chip and blocking a flow of the underfill; and
   a second dam outside the first dam, the second dam overlapping the first chip.

13. The semiconductor package as claimed in claim 12, wherein:
   the second dam overlaps at least one of the plurality of interconnections, and
   an insulating layer is between the second dam and the at least one of the plurality of interconnections, such that the second dam and the at least one of the plurality of interconnections define a capacitor.

14. The semiconductor package as claimed in claim 12, wherein each of the first dam and the second dam has an "I" shape and overlaps an edge portion of the first chip.

15. The semiconductor package as claimed in claim 12, wherein the first dam and the second dam are outside the plurality of bumps.

16. The semiconductor package as claimed in claim 12, wherein the first dam and the second dam overlap two edge portions of the first chip.

17. The semiconductor package as claimed in claim 16, wherein each of the first dam and the second dam has a "¬" shape on the substrate.

18. A semiconductor package, comprising:
   a substrate;
   a first chip on the substrate;
   a plurality of first pads on the substrate;
   a plurality of bumps on the substrate, the plurality of bumps being electrically connecting the substrate and the first chip;
   an underfill that fills a space between the substrate and the first chip; and
   a first dam on the substrate and extending along an edge portion of the first chip, at least a portion of the first dam overlapping the first chip.

19. The semiconductor package as claimed in claim 18, further comprising a second dam adjacent to the first dam and extending on the substrate, the second dam overlapping the first chip.

20. The semiconductor package as claimed in claim 18, further comprising:
   a second chip on the first chip;
   a plurality of second pads on an edge portion of the substrate; and
   a plurality of conductive wires connecting the plurality of second pads and the second chip.

* * * * *